United States Patent
Udagawa et al.

(10) Patent No.: US 6,762,820 B2
(45) Date of Patent: Jul. 13, 2004

(54) EXPOSURE APPARATUS AND DEVICE MANUFACTURING METHOD

(75) Inventors: Kenji Udagawa, Chiyoda-ku (JP); Tomoyuki Yoshida, Chiyoda-ku (JP); Michinori Hashimoto, Koto-ku (JP); Fumio Karibe, Koto-ku (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/948,796

(22) Filed: Sep. 10, 2001

(65) Prior Publication Data

US 2002/0036760 A1 Mar. 28, 2002

(30) Foreign Application Priority Data

Sep. 8, 2000 (JP) ........................................ 2000-274050
Sep. 5, 2001 (JP) ........................................ 2001-268742

(51) Int. Cl.[7] .......................... G03B 27/52; G03B 27/42
(52) U.S. Cl. .......................................... 355/30; 355/53
(58) Field of Search ..................................... 355/30, 53

(56) References Cited

U.S. PATENT DOCUMENTS

| | | | | |
|---|---|---|---|---|
| 4,548,628 A | * | 10/1985 | Miyake et al. ................. | 28/104 |
| 4,704,348 A | * | 11/1987 | Koizumi et al. ............... | 355/30 |
| 4,786,947 A | | 11/1988 | Kosugi et al. | |
| 5,430,303 A | | 7/1995 | Matsumoto et al. ..... | 250/492.2 |
| 5,685,895 A | | 11/1997 | Hagiwara et al. ............. | 96/117 |
| 5,877,843 A | * | 3/1999 | Takagi et al. .................. | 355/30 |
| 5,892,572 A | * | 4/1999 | Nishi ........................... | 355/30 |
| 5,906,429 A | | 5/1999 | Mori et al. ................... | 362/293 |
| 6,153,877 A | * | 11/2000 | Ashida ......................... | 250/216 |
| 6,208,406 B1 | | 3/2001 | Nakashima ................... | 355/30 |
| 6,297,871 B1 | | 10/2001 | Hagiwara ..................... | 355/30 |
| 6,356,338 B2 | * | 3/2002 | Arakawa ...................... | 118/719 |
| 6,445,441 B1 | * | 9/2002 | Mouri .......................... | 40/669 |
| 6,535,270 B1 | | 3/2003 | Murayama | |
| 2003/0035087 A1 | | 2/2003 | Murayama | |

FOREIGN PATENT DOCUMENTS

| | | |
|---|---|---|
| JP | 6-232022 | 8/1994 |
| JP | 9-283401 | 10/1997 |

* cited by examiner

*Primary Examiner*—Rodney Fuller
(74) *Attorney, Agent, or Firm*—Oblon, Spivak, McClelland, Maier & Neustadt, P.C.

(57) ABSTRACT

A chemical filter, which removes chemical pollutants from gas and controls temperature fluctuation of the gas before and after passing through the filter to within a predetermined range, is arranged in a portion of a ventilation path extending from a machine chamber housing at least a portion of an air conditioning unit to a main body chamber housing an exposure apparatus main body. Accordingly, the atmosphere around the exposure apparatus main body arranged downstream of the chemical filter is kept chemically clean, and the temperature fluctuation of the gas, of which the temperature is set to a target temperature by the air conditioner, after passing through the chemical filter is limited. That is, occurrence of a problem such as an illumination reduction caused by tarnish of optical members and an increase of the temperature fluctuation amount of the gas supplied into the main body chamber can be effectively limited.

21 Claims, 8 Drawing Sheets

EXPOSURE APPARATUS AND DEVICE MANUFACTURING METHOD

BACKGROUND OF THE INVENTION

1. Field of The Invention

The present invention relates to an exposure apparatus and a device manufacturing method. More particularly, the present invention relates to an exposure apparatus used in a lithography process in manufacturing semiconductor devices, liquid crystal devices and the like, and a device manufacturing method with which exposure is performed by using the exposure apparatus.

2. Description of The Related Art

Since before, in a lithography process to manufacture semiconductor devices, liquid crystal display devices and the like, a reduction projection exposure apparatus of a step-and-repeat method (a so-called stepper) and a scanning projection exposure apparatus of a step-and-scan method (a so-called scanning stepper) have been mainly used.

In recent years, the exposure apparatuses have used shorter wavelengths for exposure under the demand for improvement of resolution responding to finer circuit patterns in accordance with higher integration of semiconductor devices and the like. Currently, a KrF excimer laser with an oscillation wavelength of 248 nm and an ArF excimer laser with a shorter oscillation wavelength of 193 nm are used as a light source. In the exposure apparatus using such a light source with a short wavelength, from a viewpoint that the sensitivity of resist needs to be increased to compensate for the shortage of brightness of each light source, a high sensitive, chemically amplified resist has been used as the resist that coats a substrate. The sensitive emulsion of the chemically amplified resist contains acid generating agent; catalytic reaction is induced in a subsequent thermal processing (PEB: post-exposure-bake) by the acid generated in exposure, and insolubleness (negative type) or solubleness (positive type) of the resist to a developer is promoted.

It has been found out recently that a trace of gas in the atmosphere causes adverse effect to the exposure apparatus. For example, when a substrate is coated with a positive type chemically amplified resist, a phenomenon occurs that a trace of base gas of a ppb level in the atmosphere neutralizes an acid catalysis generated on the surface of the positive type chemically amplified resist to form a surface hard-soluble layer, and that a resist's section, which is to be rectangular, is shaped like a visor called a T-shape that resembles a letter T after the exposure and development are performed. Overcoat is needed since the chemically amplified resist as a high sensitive resist cannot be used alone, and thus the throughput reduces.

Moreover, with shorter wavelengths and higher illumination of an exposure beam, for example, ammonia gas, sulfur oxide, organosilicon and the like in the atmosphere chemically react to strong energy of short wavelength ultraviolet light and precipitate on the surfaces of optical elements in the exposure apparatus as tarnish substances. It has been found out that a certain amount of the precipitation causes the scattering and the absorption of light beams and thus phenomena such as the decreases of degree and uniformity of illumination on the irradiated surface. Accordingly, it is becoming a matter of importance to control chemical pollutants in the atmosphere to a low concentration.

For this reason, it is required that the environment inside a current exposure apparatus is strictly controlled.

On the other hand, since the exposure apparatus is an extremely precise apparatus, the temperature state inside the apparatus needs to be controlled to a constant level in order to make each section thereof exert its desired performance. For such temperature control, a conventional exposure apparatus is designed to keep the space inside an environmental chamber in a uniform temperature distribution by sending a gas, whose temperature is controlled by a temperature control unit, into the environmental chamber where the exposure apparatus main body is housed. In addition, to keep the concentration of the foregoing chemical pollutants such as ammonia to a low level, the chemical pollutants need to be removed before the gas whose temperature is controlled is sent into the environmental chamber. For this purpose, a filter unit that removes chemical pollutants in the gas by chemical adsorption and physical adsorption (hereinafter, also referred to as a "chemical filter" for convenience) is generally used.

There is no doubt that realization of higher integration of semiconductor devices will be required in future. Accordingly, an exposure apparatus is required to realize even more accurate exposure. Thus, further improvement of performance of each element in the exposure apparatus is demanded. One such demand is further improvement of the temperature control performance inside the environmental chamber.

However, it has been found recently that when gas for air conditioning, e.g., air of which the temperature fluctuation amount relative to a target temperature is strictly controlled to a value or less by an air conditioner or the like is sent into the environmental chamber to highly accurately control the temperature inside the environmental chamber, the temperature fluctuation amount, relative to the target temperature, of the air sent into the chamber increases in the environmental chamber. Therefore, the temperature fluctuation is likely to block the realization of higher exposure accuracy required in the future.

The inventors presumed that constituents for improving the exposure accuracy cause the above increase of the temperature fluctuation amount because it has appeared after the exposure accuracy has become greatly high, and repeated various kinds of experiments and the like under the presumption. As a result, the inventors found out that the temperature fluctuation amount of the air increases after the air passes through the foregoing chemical filter unit rather than before.

SUMMARY OF THE INVENTION

The present invention was made based on the foregoing novel findings obtained by the inventors. A first object of the present invention is to provide an exposure apparatus capable of simultaneously limiting the illumination reduction caused by tarnish of optical members and an increase of the temperature fluctuation amount.

A second object of the present invention is to provide a device manufacturing method capable of manufacturing highly integrated micro-devices with good productivity.

According to the first aspect of this invention, there is provided an exposure apparatus, comprising: an exposure apparatus main body that exposes a substrate to an energy beam so as to form a predetermined pattern on said substrate; a main body chamber that encloses at least a portion of said exposure apparatus main body; an environmental control unit connected to said main body chamber to supply a predetermined gas into said main body chamber to control an environment inside said main body chamber; and at least one first filter unit that is arranged in a portion of a ventilation path of said gas supplied into said main body chamber by said environmental control unit, removes chemical pollutants from said gas, and controls temperature fluctuation of said gas after passing through the first filter unit to within a predetermined range.

The ventilation path of the gas supplied into the main body chamber by the environmental control unit is not limited to the ventilation path between the environmental control unit and the main body chamber, but specifically includes an air-supply path in the environmental control unit and the main body chamber, in its concept.

With this ventilation path, the first filter unit that removes chemical pollutants from the gas and controls the temperature fluctuation of the gas after passing the filter unit to within the predetermined range is arranged in a portion of the ventilation path of the gas supplied into the main body chamber by the environmental control unit. Accordingly, the space including the ventilation path in the downstream of the first filter unit has an atmosphere from which chemical pollutants is removed and the temperature fluctuation of the gas, whose target temperature has been set by the environmental control unit, after passing the first filter unit is controlled. That is, the atmosphere around the exposure apparatus main body can be kept chemically, highly clean, and occurrence of problems such as the illumination reduction caused by tarnish of the optical members can be effectively controlled for a long period of time. Moreover, the increase of the temperature fluctuation amount of the gas supplied into the main body chamber can be effectively controlled as well.

In this case, said first filter unit may control temperature fluctuation of said gas after passing through the first filter unit such that temperature error, relative to a target temperature, of said gas after passing through lies within a predetermined range. In such a case, the inventors confirmed through experiments that the temperature of the gas after passing the first filter unit can be controlled to a degree of a temperature fluctuation amount with which the performance of the exposure apparatus is maintained for a long period of time.

In addition, as described, the inventors were convinced that the chemical filter unit is a factor to increase the temperature fluctuation amount of the gas after passing the filter unit. The inventors further studied the factors of the temperature fluctuation of the gas after passing the filter unit, and discovered that the humidity fluctuation before passing the filter unit has an influence larger than expected on the temperature of the gas after passing the filter unit.

The followings are considered to be the reason why the humidity fluctuation of the gas before passing the filter unit influences the temperature of the gas after passing the filter unit. When the gas passes the filter unit, exchange of moisture between the filter unit and the gas is performed until equilibrium is reached between the filter unit and the gas. At this point, when the moisture moves (adsorbs) from the gas to the filter unit, heat of adsorption is generated in the filter unit, and the temperature of the gas passing the filter unit rises. When the moisture moves (vaporizes) from the filter unit to the gas, the filter unit is deprived of heat of vaporization, and the temperature of the gas passing the filter unit drops. Accordingly, even if the temperature of the gas passing the filter unit is kept within the predetermined temperature range, the temperature of the gas after passing the filter unit fluctuates because the quantity of heat given or deprived of also fluctuates when the humidity of the gas before passing the filter unit fluctuates.

It is noted that humidity fluctuation before passing through the filter unit corresponds to humidity fluctuation of air in the clean room where the main body chamber is installed. Here, so as to minimize the humidity fluctuation before passing through the filter unit, a function for minimizing the humidity fluctuation may be added to the environmental control unit. Meanwhile, the control of humidity fluctuation, before passing through the filter unit, that is required to adjust the temperature of the gas to a target temperature after passing through the filter unit is smaller than the humidity fluctuation of air in the clean room. If the environmental control unit needs to keep the humidity fluctuation of air in the clean room below the limit, the environmental control unit becomes more expensive in equipment cost and larger.

In an exposure apparatus of the present invention, said first filter unit may comprise a filter section having one or more filter media that remove chemical pollutants contained in said gas and that perform adsorption of moisture in said gas and discharge of moisture into said gas. In such a case, if the adsorption of the moisture in the gas and the discharge of the moisture into the gas by the filter section are controlled to within the predetermined range, the fluctuation of the temperature error of the gas relative to the target temperature before/after passing the filter section can be minimized.

In this case, said filter section may have at least two filter media that are arranged a predetermined distance apart in a passage direction of said gas. In such a case, the adsorption and the discharge of the moisture in the gas can be controlled within the predetermined range without reducing the capability of removing chemical pollutants, and the temperature fluctuation of the gas can be controlled. The reason is considered to be as follows.

Since at least two filter media are arranged along the passage direction of the gas in the predetermined distance, an area where the filter medium does not exist (a mid-space layer) is made in a gap between the filter media. And, the passing of the gas through the first (or a few media in the upstream) filter medium in the gas passage direction allows the gas to give or receive the moisture to or from the filter medium so as to reduce the humidity of the gas when the humidity of the gas is high and so as to increase the humidity of the gas when the humidity of the gas is low, for the same reason as the foregoing. That is, the humidity fluctuation of the gas converges on a constant value. Meanwhile, when the gas passes the subsequent filter media, a moisture quantity of the gas changes little because the humidity is substantially kept at a constant level. Thus, only chemical pollutants are removed from the gas, and the temperature of the gas changes little. In other words, since the temperature change of the gas occurs only in the first (or a few media in the upstream) filter medium in the gas passage direction without reducing the capability of removing chemical pollutants, the adsorption and discharge of the moisture in the gas can be controlled to within the predetermined range and the temperature fluctuation of the gas can be controlled.

In an exposure apparatus of the present invention, at least one of said filter media may have at least one portion of which a packing ratio is set to be lower than the other portions. In such a case, since the adsorption and discharge of the moisture in the gas can be controlled, the temperature error of the gas after passing the first filter unit relative to the target temperature can be minimized.

It is noted that the phrase "at least one of said filter media may have at least one portion of which a packing ratio is set to be lower than the other portions" means not only the case where the packing ratio of a portion of the same filter medium is set to be lower than the other portions, but also the case where a plurality of filter media are used and where the packing ratio is different among the filter media.

In an exposure apparatus of the present invention, said environmental control unit may comprise a gas supply fan that supplies said gas into said main body chamber via said first filter unit and a temperature adjustment unit that adjusts the temperature of said gas to within a predetermined range. In such a case, the gas whose temperature is adjusted within the predetermined range by the temperature adjustment unit is supplied into the main body chamber by the gas supply fan. At this point, the gas supplied from the gas supply fan is supplied into the space via the first filter unit, the temperature change of the gas being small after it passes the first filter unit. Accordingly, a chemically clean gas from which chemical pollutants are sufficiently removed and of which the temperature error relative to the target temperature is sufficiently limited is supplied into the main body chamber (in more detail, downstream of the first filter unit), and thus the chemical environmental condition and temperature condition in the main body chamber can be controlled to desired conditions.

In this case, said temperature adjustment unit may include a cooling unit that cools down said gas supplied by said gas supply fan. In such a case, the temperature of the gas before passing the first filter unit can be adjusted to within a predetermined range by cooling down the gas by the cooling unit when, for example, the gas heated to hotter than the target temperature is supplied from outside.

In this case, said cooling unit may be set to be at such a temperature as does not cause dew condensation on surfaces thereof.

In an exposure apparatus of the present invention, when the temperature adjustment unit comprises a cooling unit, said temperature adjustment unit may further include a heating unit that heats said gas supplied into said main body chamber by said gas supply fan. In such a case, the temperature of the gas before passing the first filter unit can be adjusted to within a predetermined range regardless of the temperature of the gas supplied from outside.

In an exposure apparatus of the present invention, regardless of presence of a cooling unit, said temperature adjustment unit may include a heating unit that heats said gas supplied into said main body chamber by said gas supply fan. In such a case, the temperature of the gas before passing the first filter unit can be adjusted to within a predetermined range by heating the gas when, for example, the gas cooled down to cooler than the target temperature is supplied from outside.

In an exposure apparatus of the present invention, an exposure room that houses said exposure apparatus main body maybe provided in said main body chamber, and said first filter unit may be arranged in a supply path of said gas supplied to said exposure room. In such a case, the first filter unit, which removes chemical pollutants and controls the temperature fluctuation of the gas after passing the filter unit to within a predetermined range, is arranged in the supply path of the gas supplied to the exposure chamber. Accordingly, the chemically clean gas from which chemical pollutants are sufficiently removed and of which the temperature fluctuation is controlled is supplied into the exposure room. Thus, the peripheral atmosphere of the exposure apparatus main body can be kept chemically clean. Further, since the temperature fluctuation of the gas after passing the first filter unit is small, the temperature fluctuation of the gas after passing the filter unit can be controlled within a predetermined range if, for example, the temperature control of the gas is accurately performed by the environmental control unit before the gas passes the first filter unit.

In an exposure apparatus of the present invention, said exposure apparatus main body may include a substrate stage that holds said substrate and an interferometer that measures the position of said substrate stage, and said first filter unit may be arranged in a supply path of said gas supplied into a portion of the space of said main body chamber where said substrate stage and said interferometer are arranged. In such a case, the first filter unit capable of removing chemical pollutants and controlling the temperature fluctuation is arranged in the supply path of the gas supplied into the partial space of the main body chamber where the substrate stage and the interferometer are arranged. Accordingly, the measurement error of the interferometer caused by air variation (temperature variation) can be controlled as much as possible, and positional control of the substrate stage, which particularly requires accuracy, can be performed with the required accuracy.

In an exposure apparatus of the present invention, a substrate transportation system housing chamber, in which a substrate transportation system that carries said substrate into said exposure apparatus main body and that carries said substrate out of said exposure apparatus main body is housed, may be provided in said main body chamber, and said first filter unit may be arranged in a supply path of said gas supplied into said substrate transportation system housing chamber. In such a case, the inside of the substrate transportation system housing chamber in which the substrate transportation system that carries the substrate into the exposure apparatus main body and that carries the substrate out of the exposure apparatus main body is housed can be chemically clean and be stable in temperature. Further, in the case where the chemically amplified resist, which is easily affected by chemical pollutants, coats the substrate, the surface of the chemically amplified resist can be prevented from becoming hard-soluble, in the substrate transportation system housing chamber as well.

In an exposure apparatus of the present invention, a mask transportation system housing chamber, in which a mask transportation system that carries a mask having said pattern formed into said exposure apparatus main body and that carries said mask out of said exposure apparatus main body is housed, may be provided in said main body chamber, and said first filter unit may be arranged in a supply path of said gas supplied into said mask transportation system housing chamber. In such a case, the inside of the mask transportation system housing chamber in which the mask transportation system that carries the mask into the exposure apparatus main body and that carries the mask out of the exposure apparatus main body is housed can be chemically clean and be stable in temperature.

An exposure apparatus according to the present invention may further comprise: a machine chamber that houses at least a portion of said environmental control unit and is connected to said main body chamber to constitute a circulation path of said gas together with said main body chamber; and at least one second filter unit arranged in an exhaust path returning from said main body chamber to said machine chamber, the second filter unit having a higher removal ratio of said chemical pollutants than said first filter unit. In such a case, since the second filter unit is arranged in the exhaust path returning from the main body chamber to the machine chamber, after chemical pollutants coming out of the elements into the gas in the exposure apparatus main body are effectively removed by the second filter unit, the gas is supplied again through the first filter unit into the main body chamber by the environmental control unit, at least a portion of which is housed in the machine chamber. Thus, the peripheral atmosphere of the exposure apparatus main body in the main body chamber can be kept chemically clean, and the illumination reduction and the like caused by tarnish of the optical members can be effectively limited for a long period of time. In addition, the second filter unit removes chemical pollutants, and the chemically clean gas is supplied to the first filter unit. Furthermore, because the temperature fluctuation need not be considered of the exhaust path returning from the main body chamber to the machine chamber, even if the temperature fluctuation of the gas after passing the filter unit is large, the chemically clean gas from which chemical pollutants have been effectively removed can be supplied to the first filter unit by using the filter unit having a high capability of removing chemical pollutants, without causing a problem. Therefore, the lifetime of the first filter unit lengthens, and replacement of the filter is unnecessary for a long period of time.

An exposure apparatus of the present invention may further comprise: a machine chamber that houses at least a portion of said environmental control unit and is provided with an outside gas intake; and at least one second filter unit arranged in a path of outside gas taken in through said outside gas intake, the second filter unit having a higher removal ratio of said chemical pollutants than said first filter unit. In such a case, since the second filter unit is arranged in the path of the gas taken in from the outside air intake provided in the machine chamber, the chemically clean, outside air from which chemical pollutants have been removed by the second filter unit is taken in the unit by the second filter unit. Thus, the peripheral atmosphere of the exposure apparatus main body in the main body chamber can be kept chemically clean, and the illumination reduction and the like caused by tarnish of the optical members can be effectively limited for a long period of time. In addition, the second filter unit removes chemical pollutants, and the chemically clean gas is supplied to the first filter unit. Furthermore, because the temperature fluctuation need not be considered of the path of outside air inside the machine chamber, even if the temperature fluctuation of the gas after passing the filter unit is large, the chemically clean gas from which chemical pollutants have been effectively removed can be supplied to the first filter unit by using the filter unit having a high capability of removing chemical pollutants, without causing a problem. Therefore, the lifetime of the first filter unit lengthens, and replacement of the filter is unnecessary for a long period of time.

In the exposure apparatus of the present invention, the surface of said substrate may be coated with chemically amplified resist as a photosensitive emulsion. In such a case, the surface of the chemically amplified resist can be almost prevented from becoming hard soluble because the inside of the main body chamber can be kept chemically clean.

Furthermore, in the lithography process, the illumination reduction and the like caused by tarnish of the optical members can be effectively limited for a long period of time by performing exposure using an exposure apparatus of the present invention. Thus, highly integrated devices can be manufactured with high productivity while maintaining the high throughput. Therefore, according to the second aspect of this invention, there is provided a device manufacturing method using the exposure apparatus of this invention.

BRIEF DESCRIPTION OF THE DRAWINGS

In accompanying drawings.

DETAILED DESCRIPTION OF THE PREFERRED EMBODIMENTS

Figure 1:
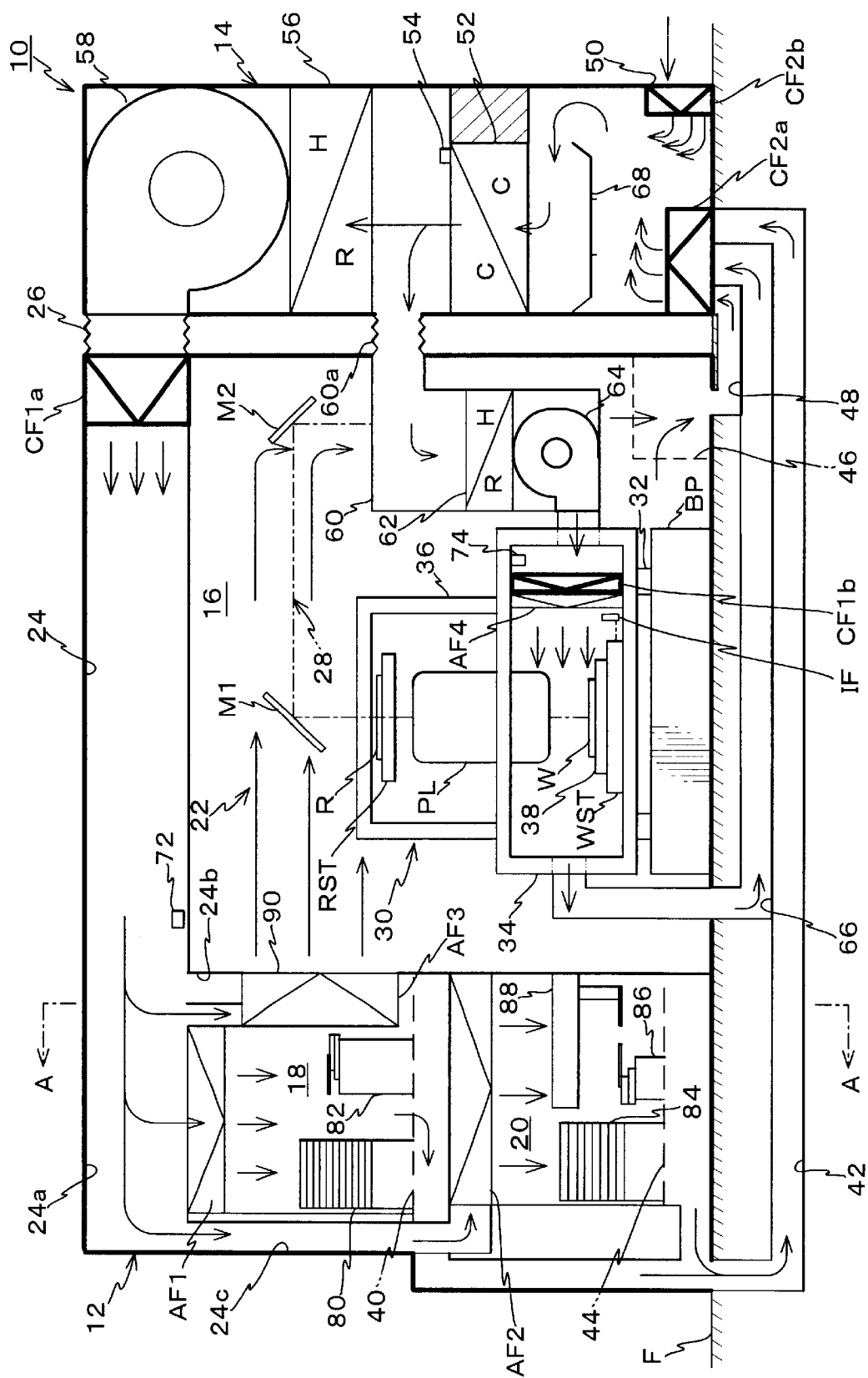
FIG. 1 is a view schematically showing the entire constitution of an exposure apparatus according to an Gus embodiment of the present invention.

In the following, an embodiment of the present invention will be described with reference to FIG. 1 to FIG. 6. FIG. 1 schematically shows the entire constitution of an exposure apparatus 10 according to the embodiment.

The exposure apparatus 10 comprises a main body chamber 12 installed on a floor F in a clean room and a machine chamber 14 arranged adjacent to the main body chamber 12.

The inside of the main body chamber 12 is maintained in constant environmental conditions (cleanliness, temperature, pressure and the like), and a large room 16 closer to the machine chamber 14 and two small rooms 18 and 20 arranged in upper and lower stages on the side of the large room 16 reverse to the machine chamber 14. The large room 16 is the exposure room housing an exposure apparatus main body 22 inside thereof. Hereinafter, the large room 16 is referred to as the exposure room 16.

In the small room 18, a reticle library 80 holding a plurality of reticles as masks and a reticle loader 82 that consists of a horizontal revolute robot are sequentially arranged from the position farthest from the exposure room 16. A reticle R is carried onto a reticle stage RST (described later) that is a part of the exposure apparatus main body 22, and also carried from the reticle stage RST by the reticle loader 82. In this embodiment, the reticle library 80 and the reticle loader 82 constitute a reticle loader system as the mask transportation system, and the reticle loader system is housed in the small room 18. Hereinafter, the small room 18 will be referred to as a reticle loader room 18. The reticle loader room 18 constitutes the mask transportation system housing.

Note that the reticle loader system is not limited to the foregoing constitution. For example, a closed cassette of a bottom-open type (container) that houses a plural number of reticles may be used instead of the reticle library 80, or a mechanism of sliding a transportation arm can be used as the reticle loader. Alternatively, a reticle storing section (the reticle library 80) and the reticle loader 82 maybe severally arranged in different rooms, or the foregoing closed cassette may be mounted on the top of the reticle loader room 18 so that the bottom of the cassette is opened and then the reticle is carried into the reticle loader room 18 while maintaining its airtight state. Specifically, only the reticle loader may be arranged in the small room 18.

Further, the other small room 20 houses a wafer carrier 84 that holds wafers as a plurality of substrates, a horizontal revolute robot 86 that carries the wafer into/from the wafer carrier 84, and a wafer transportation unit 88 that transports the wafer between the robot 86 and a wafer stage WST as a substrate stage constituting the exposure apparatus main body 22. In this embodiment, the wafer carrier 84, the robot 86 and the wafer transportation unit 88 constitute a wafer loader system as the substrate transportation system, and the wafer loader system is housed in the small room 20. Hereinafter, the small room 20 will be referred to as a wafer loader room 20. The wafer loader room 20 constitutes the substrate transportation system housing.

Note that the wafer loader system sis not limited to the foregoing constitution. For example, only the revolute robot may constitute the wafer loader system, or only the wafer loader may be arranged in the wafer loader room 20.

The foregoing exposure room 16, the reticle loader room 18 and the wafer loader room 20 are connected to the machine chamber 14 via air-supply duct 24 as the air-supply path, which is made of a material emitting little gas such as stainless steel (SUS), Teflon (registered trademark) or the like, and an expandable, bellows-like connector 26.

The exposure apparatus main body 22 housed in the exposure room 16 comprises: an illumination optical system 28 including mirrors M1 and M2; a projection optical system PL arranged under the illumination optical system 28; the reticle stage RST that holds the reticle R as the mask, which is arranged between the projection optical system PL and the illumination optical system 28; the wafer stage WST that holds a wafer W as the substrate, which is arranged underneath the projection optical system PL; a body column 30 that holds the projection optical system PL and in which the wafer stage WST is mounted; and the like.

The illumination optical system includes an optical integrator, an aperture stop (both are not shown) and the like, other than the mirrors M1 and M2, and is composed by housing these optical members in an illumination system housing (not shown) in a predetermined positional relation. The illumination optical system 28 is connected to the excimer laser such as the KrF excimer laser (output wavelength of 248 nm) or the ArF excimer laser (output wavelength of 193 nm) as the light source (not shown) via a guiding optical system (a relay optical system, not shown). The guiding optical system includes an optical system for an optical axis adjustment between the light source and the illumination optical system 28 at least in a portion thereof, which is called a beam-matching unit. Although not shown in the drawing, the inside of the illumination system housing in which the illumination optical system 28 is housed and a case (a mirror barrel) in which the guiding optical system is housed is severally replaced by an inert gas (nitrogen, helium or the like, for example), and thus the extremely good cleanliness is maintained.

Note that at least a portion of the illumination optical system 28 may be arranged outside the exposure room 16, and, in addition to this or separately from this, a portion of the remaining members (the wafer stage WST, for example) except for the light source, the guiding optical system, and the illumination optical system may be arranged in a case different from the exposure chamber. In this case, the foregoing different case may be arranged in the exposure room or may be arranged outside the exposure chamber. In short, at least a portion of the exposure apparatus main body needs to be arranged in the exposure room 16, and any choice of members to be arranged in the exposure room 16 and the constitution thereof is possible.

The body column 30 is supported above a base plate BP installed on the bottom surface of the main body chamber 12 via a plurality of anti-vibration blocks 32. The body column 30 includes: a main column 34 supported by the anti-vibration blocks 32; and a support column 36 provided on the main column 34 in a standing manner. The projection optical system PL is held on a main frame that constitutes the ceiling surface of the main column 34 via a holding member called a first invar (not shown), with the optical axis direction of the system set in a vertical direction. Herein, as the projection optical system PL, a reduction optical system having the projection magnification of ¼ or ⅕ is used. The support column 36 supports at least a portion of the illumination housing (not shown) from underneath.

The wafer stage WST is driven by a plane motor, a linear motor or the like (not shown) on a stage base, which constitutes the bottom plate of the main column 34, in the two-dimensional direction. The wafer W is fixed on the upper surface of the wafer stage WST by vacuum suction or the like via a wafer holder 38. The position of the wafer stage WST in an XY plane and a rotation quantity (at least one of a yawing quantity, a pitching quantity and a rolling quantity) are measured by a laser interferometer IF as an interferometer, with resolving power of, for example, about 0.5 to 1 nm via a moving mirror (not shown).

The reticle stage RST is mounted on a reticle stage base (not shown), which constitutes the ceiling portion of the supporting member called a second invar (not shown), provided on the upper surface of the main column 34. The reticle stage RST is constituted so as to be finely driven in a horizontal plane when the exposure apparatus main body 22 is of a stationary exposure type, and is constituted so as to be movable also by a predetermined stroke distance in a predetermined scanning direction when the body 22 is of a scanning exposure type.

According to the exposure apparatus main body 22 constituted as described above, a pulse ultraviolet light emitted from the excimer laser (not shown) is shaped by the illumination optical system 28 that consists of various kinds of lenses, mirrors and the like to have a necessary size and illumination uniformity, and illuminates the reticle Ron which a predetermined pattern is formed. And then, the pattern formed on the reticle R is reduced and transferred onto each shot area on a wafer W held on the wafer stage WST via the projection optical system PL.

In this embodiment, wafers W of which the surfaces are coated with, e.g., a positive-type and chemically-amplified-type resist as a photosensitive material are used.

The chemical filter CF1$a$ as the first filter unit is arranged at one end (end portion closer to the machine chamber 14) of the air-supply duct 24 in the main body chamber 12. Note that the constitution and the like of the chemical filter CF1$a$ will be described later.

The other end of the air-supply duct 24 diverges into two; one diverged path 24$a$ is connected to the reticle loader room 18, and a filter box AF1 that consists of a ULPA filter (ultra low penetration air-filter), which removes particles from the air flowing into the reticle loader room 18, and a filter plenum is provided at an ejection port area of the reticle loader room 18. In addition, a return section 40 is provided on the other side of the reticle loader room 18 opposite to the filter box AF1; one end of a return duct 42 as the exhaust path is connected to the outside portion of the return section 40, and the other end of the return duct 42 is connected to a portion of the bottom surface of the machine chamber 14.

A diverged path 24c is further provided to the diverged path 24a. The diverged path 24c is connected to the wafer loader room 20, and a filter box AF2 that consists of the ULPA filter, which removes particles from the air flowing into the reticle loader room 18, and the filter plenum is provided at an ejection port area of the wafer loader room 20. In addition, a return section 44 is provided on the other side of the wafer loader room 20 opposite to the filter box AF2, and an ejection port connecting with the return duct 42 is provided at the other side of the return section 44 reverse to the wafer loader room 20.

Figure 2:
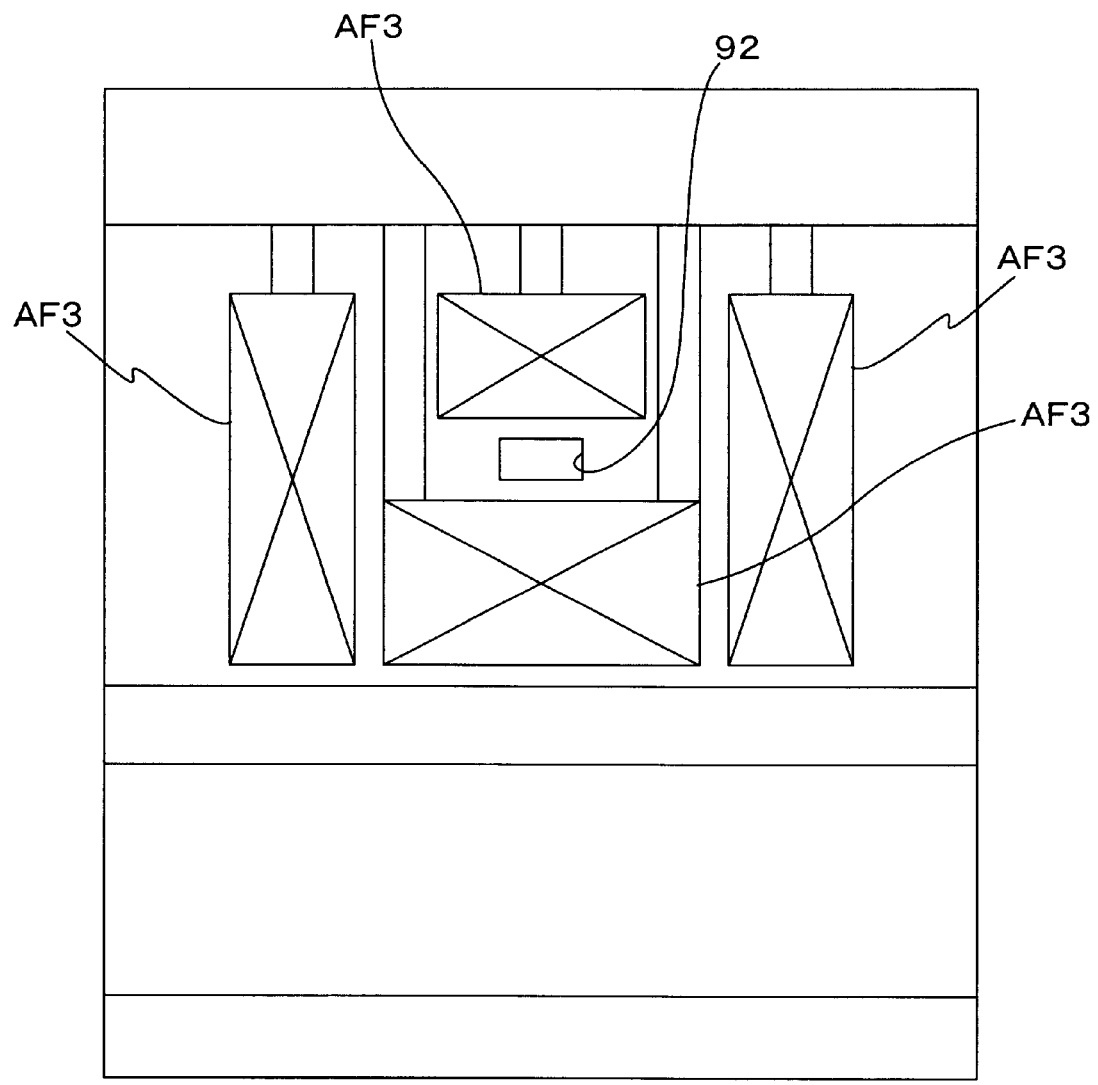
FIG. 2 is a cross-sectional view taken along A—A line of FIG. 1.

Moreover, another diverged path 24b is connected to a filter box AF3 that consists of the ULPA filter, which removes particles from the air flowing into the exposure room 16, and the filter plenum, the filter box AF3 being arranged on the side of an ejection port 90, made in the boundary area between the reticle loader 18 and the exposure room 16, which side is closer to the reticle loader room 18. Then, a uniform air flow is sent into an upper space of the exposure room 16 from the ejection port 90 in side-flow. At the boundary area between the reticle loader 18 and the exposure room 16, where the ejection port 90 is made, a plurality of sub-filter boxes AF3 are arranged around a reticle transportation area 92 as shown in FIG. 2, a cross-sectional view taken along a line A—A of FIG. 1.

A return section 46 is provided on the bottom of the exposure room 16 closer to the machine chamber 14 as shown in FIG. 1, an exhaust port connecting with one end of a return duct 48 as the exhaust path is made in the bottom wall of the main body chamber 12 and under the return section 46, and the other end of the return duct 48 is connected to a portion of the bottom surface of the machine chamber 14.

An OA port 50 as the outside-air intake is made in the lowest part of a side of the machine chamber 14 reverse to the main body chamber 12, and a chemical filter CF2b as the second filter unit is arranged opposite to the OA port 50 area. The inside of the main body chamber 12, particularly the inside of the exposure room 16, is always kept at a pressure larger than that of the out side to maintain cleanliness. Accordingly, air leaks from the front surface of the main body chamber, an in-line interface (not shown) and the like to the outside, and the OA port 50 is provided to take in the outside air so as to make up for the leaked air. Furthermore, in this embodiment, as a countermeasure to a so-called T-shape of the chemically-amplified-type resist and the like, the chemical filter CF2b is provided at the OA port 50 area to take only clean air into the exposure apparatus by removing chemical pollutants (impurities) in air taken into the exposure apparatus. Note that the constitution and the like of the chemical filter CF2b will be described later.

A cooler (dry coil) 52 as the cooling unit is provided at a position a little lower than the center of the inside of the machine chamber 14 in a height direction. A first temperature sensor 54 that detects the temperature of the cooler surface is arranged at the exit area of the cooler 52. The detection value of the first temperature sensor 54 is supplied to a control unit 70 (not shown in FIG. 1, see FIG. 3).

A first heater 56 as the heating unit is arranged a predetermined distance above the cooler 52 of the air path in the machine chamber 14. A first blower 58 as the gas supply fan is arranged at the exit area of the machine chamber 14 above the first heater 56.

Furthermore, under the first heater 56 of the air path in the machine chamber 14, a diverged path 60 is provided into which about ⅕ of the air having passed the cooler 52 from below to above flows, and the end portion of the diverged path 60 closer to the machine chamber 14 is constituted of and expandable bellows-like member 60a. A portion of the diverged path 60 on a side of the bellows member 60a reverse to the machine chamber 14 is arranged in the exposure room 16. A second heater 62 as the heating unit and a second blower 64 as the gas supply fan are sequentially arranged in the diverged path 60, and an air ejection port for the vicinity of the wafer stage WST is formed in an end of the second blower 64 reverse to the machine chamber 14. Note that the cooler 52, first heater 56 and second heater 62 constitute the temperature adjustment unit, and the temperature adjustment unit, first blower 58, second blower 64, a control system thereof and the like constitute an air conditioning unit as the environmental control unit.

In this embodiment, it is assumed that the relative humidity and the temperature of gas passing through the filter unit are set to about 50% and about 23° C. respectively by the environmental control unit. However, the actual ranges for setting of the relative humidity and temperature of the gas passing through the filter unit are 30 through 70% and 20 through 30° C. respectively.

A chemical filter CF1b as the first filter unit and a filter box AF4 that consists of the ULPA filter and the filter plenum is provided at the ejection port area, of the air supplied from the second blower 64, near the wafer stage WST. An open end of a return duct 66 as the exhaust path is arranged at a portion of the exposure room 16 closer to the wafer loader room 20 and opposite to the ejection port where the chemical filter CF1b and the filter box AF4 are provided, and the other end of the return duct 66 is connected to a portion of the bottom surface of the machine chamber 14. Note that the constitution and the like of the chemical filter CF1b will be described later.

An opening is made at a portion of the bottom surface of the machine chamber 14 to which surface the three return ducts 42, 48 and 66 are connected, and a chemical filter CF2a as the second filter unit is provided opposing to the opening. The chemical filter CF2a is designed to be easily attached/detached via an open/close door (not shown) provided in the machine chamber 14. Note that the constitution and the like of the chemical filter CF2a will be described later.

Furthermore, a drain pan 68 is arranged under the cooler 52 in the machine chamber 14.

A second temperature sensor 72 that detects the temperature of the air inside the air-supply duct 24 is arranged at an area, closer to the machine chamber 14, of the diverged portion of the air-supply duct 24 in the main body chamber 12. The detection values of the second temperature sensor 72 are supplied to the control unit 70 (not shown in FIG. 1, see FIG. 3).

A third temperature sensor 74 that detects the temperature of the air supplied from the second blower 64 is arranged in the upstream of the chemical filter CF1b. The detection values of the third temperature sensor 74 are supplied to the control unit 70 (not shown in FIG. 1, see FIG. 3).

Figure 3:
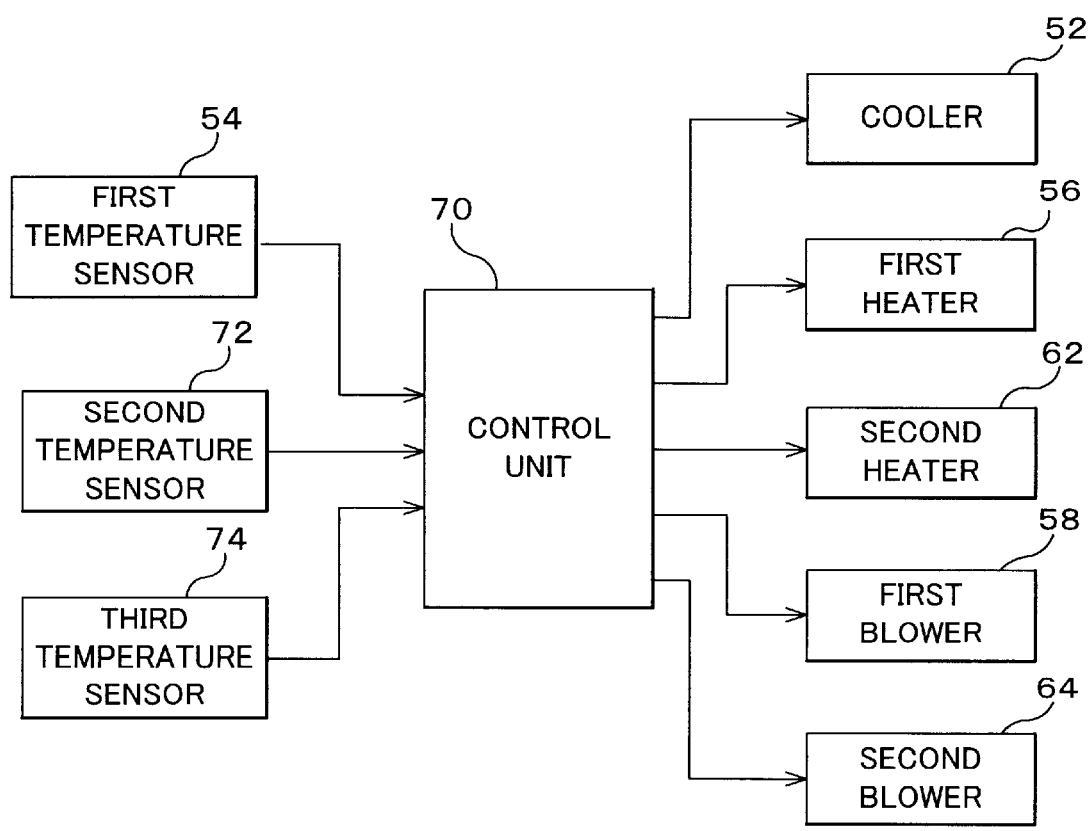
FIG. 3 is a block diagram schematically showing a control system relating to the temperature control of the exposure apparatus of FIG. 1.

FIG. 3 schematically shows the constitution of the controls system related to the temperature control of the air conditioning unit. The control system includes the control unit 70 constituted by a microcomputer (or a workstation) as the main part.

Next, description will be presented of a constitution example of the chemical filter CF2a provided opposite to the exit area made at a portion of the bottom surface of the machine chamber 14 and of the chemical filter CF2b arranged opposite to the OA port 50.

Figure 4:
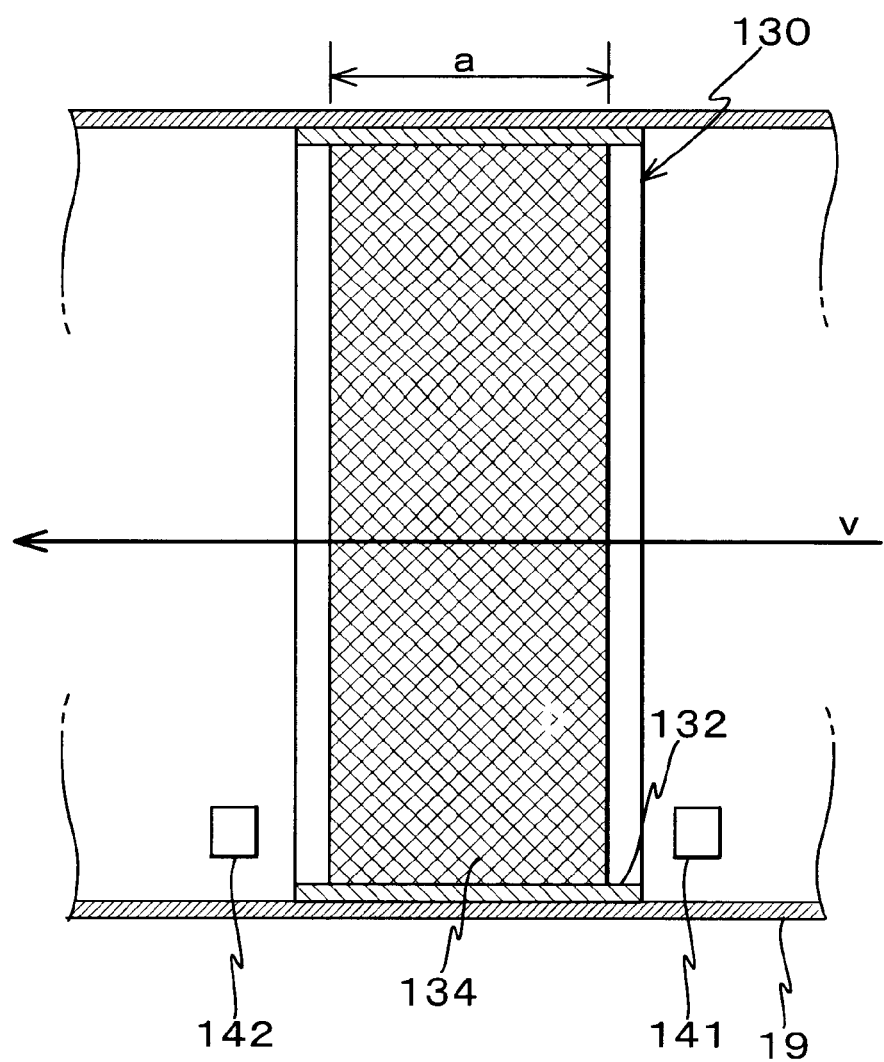
FIG. 4 is a view schematically showing the constitution of the filter unit used as chemical filters CF2$a$ and CF2$b$ of FIG. 1.

FIG. 4 schematically show a filter unit 130 used as the chemical filters CF2a and CF2b. The filter unit 130 shown in FIG. 4 comprises: a filter medium 134 having a quality of removing chemical pollutants; and a holding frame that holds the filter medium 134.

The filter holding frame 132 is a frame member whose section perpendicular to a passage direction of the gas is in a rectangular shape, and opening portions are made in both the sides in the passage direction of air (both end surfaces in the lateral direction on the drawing of FIG. 4).

The filter medium 134 is held inside the holding frame 132 in the state where all the gas (air) passing the holding frame 132 passes through the filter medium 134 (that is, air tight state). Carbon fibers forming a honeycomb structure are used as the filter medium in the filter unit 130.

In the filter medium 134, as shown in FIG. 4, the width in the passage direction of air and its packing ratio are expressed as 'a' and 'd' respectively hereinafter, and the both values are determined taking into consideration the capability of removing chemical pollutants, the size, an installment space and the like of the filter unit 130.

Next, description will be presented of a constitution and the like of the chemical filter CF1a as the first filter unit provided at one end of the air-supply duct 24 in the main body chamber and the chemical filter CF1b provided near the wafer stage WST.

As the chemical filters CF1a and CF1b, a first temperature-change-controlled chemical filter (hereinafter, referred to as a "first temperature-change-controlled filter" for convenience) 120, shown in FIG. 5, for example, a second temperature-change-controlled chemical filter (hereinafter, referred to as a "second temperature-change-controlled filter" for convenience) 120₂ shown in FIG. 6, or the like can be used.

Figure 5:
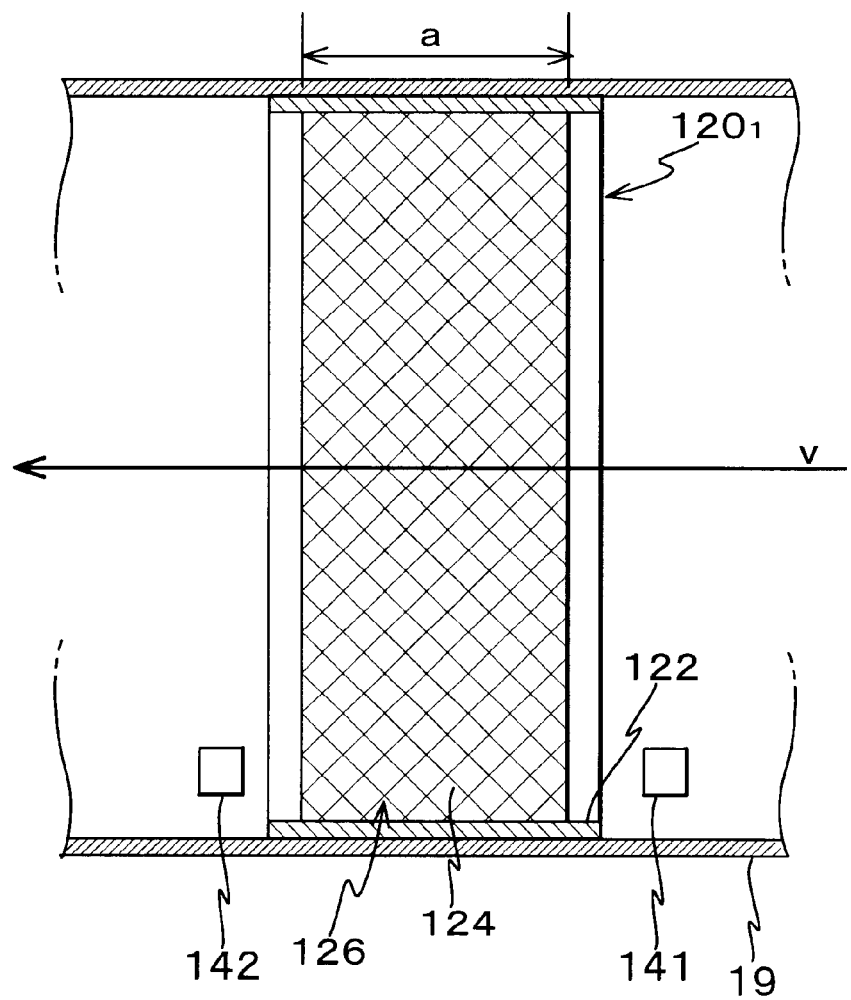
FIG. 5 is a view schematically showing the constitution of the first temperature-change-controlled filter used as chemical filters CF1$a$ and CF1$b$ of FIG. 1.

The first temperature-change-controlled filter $120_1$ comprises: a filter medium 124; and a holding frame 122 that holds the filter medium 124, as shown in FIG. 5. The holding frame 122 consists of a frame member whose section perpendicular to the passage direction of air is in the rectangular shape, and opening portions are made in both the sides in the passage direction of air (both end surfaces in the lateral direction on the drawing of FIG. 5). The holding frame 122 holds the periphery of the filter medium without a gap, and all air going into the space of the holding frame 122 passes through the filter medium 124.

In the first temperature-change-controlled filter $120_1$ of FIG. 5, a filter section 126 is constituted by only the filter medium 124. Note that the filter section 126 without the holding frame 122 can be provided in a predetermined position of the air-supply duct or the like instead of the temperature-change-controlled filter $120_1$. In this case, the wall of the air-supply duct substantially serves as the holding frame.

As the filter medium 124, a medium that consists of carbon fibers forming a honeycomb structure similar to the filter medium 134 constituting the filter unit is used.

The filter medium 124 has the same area and the same thickness 'a' as the foregoing filter medium 134, but the packing ratio (that corresponds to a density) is set to d/2 that is about a half of the packing ratio of the filter medium 134.

Incidentally, according to the findings obtained by the inventors, the filter medium (medium) that removes the chemical material in the gas generally has a characteristic of containing moisture that counterpoises the humidity of the gas, and is apt to contain more moisture as the humidity of the gas increases. Accordingly, even in this embodiment, when air is heated by heaters 56 and 62 and the humidity of the air supplied to the chemical filters CF1a and CF1b reduces, the filter medium 124 constituting the filter section 126 of the chemical filters CF1a and CF1b diffuses moisture so as to resupply it to air, the filter medium 124 is deprived of a latent heat by vaporization, and thus the temperature of the filter medium 124 drops. As a result, the temperature of the air after passing through the filter medium 124 is lower than the one before.

Contrary to the above, when air is cooled by the cooler 52 and the humidity of the air supplied to the chemical filters CF1a and CF1b increases, the filter medium 124 constituting the filter section 126 of the chemical filters CF1a and CF1b takes in and adsorbs the increment of moisture from air, a heat of adsorption (heat of condensation) is given to the filter medium 124, and thus the temperature of the filter medium increases. As a result, the temperature of the air after passing through the filter medium 124 is higher than the one before.

As described above, when even the air whose temperature is adjusted to a certain level by the heater or cooler passes through the filter medium of the chemical filter, the temperature fluctuation of the air occurs due to the humidity fluctuation of the air before passing the filter medium 124 and the foregoing characteristic of the filter medium 124. The heat quantity, of which the filter medium is deprived, as the latent heat by vaporization and the heat quantity, given to the filter medium, as the heat of adsorption are determined by the quantity of moisture adsorbed or diffused by the filter medium.

The gas temperature is determined by the heat quantity taken away from or given to the filter and the gas quantity passing through the filter medium. Specifically, when the same quantity of gas passes through the filter medium, the more moisture is diffused or adsorbed by the filter medium, the more heat is given to or taken away from the filter medium, and thus the temperature change of the gas becomes larger. Accordingly, the quantity of moisture diffused or adsorbed by the filter medium may be decreased or the passage quantity of gas may be increased to control the temperature fluctuation. For example, a larger blower may be used to increase the passage quantity of gas. However, chemical pollutants that the chemical filters must remove per hour also increase in amount, which causes the problem of decrease of the removal ratio. Thus, the passage quantity of gas has an upper limit.

For this purpose, as described above, the filter medium 124 constituting the first temperature-change-controlled filter $120_1$ has the same area and the same thickness 'a' as the foregoing filter medium 134, but the packing ratio is set to d/2 that is about a half of the packing ratio of the filter medium 134. Accordingly, the absolute amount of the moisture exchange between the filter medium 124 and the air passing through the medium is about ½ of that of the moisture exchange between the filter medium 134 and the air passing the medium. As described above, the quantity of moisture diffused or adsorbed by the filter medium 124 is made smaller than that of the filter unit 130 by the use of the first temperature-change-controlled filter $120_1$, and the temperature fluctuation of air after passing the filter medium can be controlled accordingly.

It is apprehended that the adsorption capability of the filter medium to chemical pollutants reduces when the packing ratio of the carbon fiber constituting the filter medium 124 is reduced. However, since chemical pollutants contained in the gas is extremely minor relative to moisture which occupies a few tens percent, the relation between the packing ration of the carbon fiber consisting the filter medium 124 and the adsorption capability of the filter medium 124 to chemical pollutants is not linear (not in a proportional relation). Specifically, the adsorption capability of the filter medium 124 to chemical pollutants does not reduce dramatically when the packing ratio of the carbon fiber constituting the filter medium 124 decreases. Therefore, according to the first temperature-change-controlled filter 1201, the temperature fluctuation of the gas passing through the filter can be controlled without reducing much of the capability of removing chemical pollutants in the gas.

Next, a concrete example of the first temperature-change-controlled filter 120, and a concrete experimental result obtained by using the filter will be described. Note that the experiment has been performed by using an experimental unit equipped with an air path 19 in which a temperature sensor before passage 141 and a temperature sensor after passage 142 that detect the air temperature before/after passing the filter are severally provided in the upstream and the downstream of the first temperature-change-controlled filter $120_1$. Note that, as shown in FIG. 5, a temperature control unit (not shown) that controls the air temperature is provided in the upstream of the first temperature-change-controlled filter $120_1$, and the air whose temperature is set to a target level is supplied to the first temperature-change-controlled filter $120_1$.

Note that the concrete experimental result by using the first temperature-change-controlled filter $120_1$ will be described in comparison with the foregoing filter unit 130.

In the experimental unit shown in FIG. 5, the first temperature-change-controlled filter $120_1$ comprises the filter medium 124 having the thickness of 'a' (=50 mm), in which the honeycomb carbon fiber of the density of about 0.043 g/cm$^3$ is packed, and air is made to pass through the filter at a speed 'v' (=0.5 m/sec). At this point, the target temperature of the air is set to 23° C. In addition, the humidity fluctuation of the air before passing through the first temperature-change-controlled filter $120_1$ is controlled to have such a fluctuation width as leads the temperature fluctuation width of the air passing through the filter unit 130 shown in FIG. 4 to fall within 23° C.±0.03° C. Note that the filter unit 130 comprises the filter medium 134 having the thickness of 'a' (=50 mm), in which the honeycomb carbon fiber of the density of about 0.09 g/cm$^3$ is packed.

The experiment of the first temperature-change-controlled filter $120_1$ was performed under such speed and the humidity fluctuation, and it was found out that the temperature of the air (detected by the after-passage temperature sensor 142) immediately after passing the first temperature-change-controlled filter $120_1$ becomes 23° C.±0.015° C.

Thus, it is clear that a temperature error ΔT1 of the air immediately after passing through the filter medium 124 with respect to the target temperature and a temperature error ΔT2 of the air immediately after passing through the filter medium 134 of the filter unit 130 with respect to the target temperature have the relation of ΔT1/ΔT2=0.5.

Through the experiment, it was confirmed that the first temperature-change-controlled filter $120_1$ could control the temperature fluctuation of the air after passing the filter to approximately half of the temperature fluctuation caused by the filter unit 130. Furthermore, increase of the temperature error of the air after passing the filter is sufficiently within a permissible range, and thus it does not give adverse effect to the operation of the exposure apparatus main body 22 provided in the exposure room 16 of the main body chamber 12.

Description has been made for the case where the packing ratio of the carbon fiber of the filter medium 124 is made to be ½ of that of the filter medium constituting the filter unit 130 of FIG. 4 as the concrete example of the first temperature-change-controlled filter $1201_1$. But, the packing ratio of the filer medium can be further reduced within such a range that the reduction of the removing power is permissible. Alternatively, if the packing ratio of the filter medium 124 is the same as the above case, the temperature fluctuation of the air after passing the filter medium can be controlled by making the thickness 'a' thinner, similarly to the case where the packing ratio is reduced.

In addition, the entire packing ratio of the filter medium 124 of the first temperature-change-controlled filter $120_1$ is set to a low level. The filter is not limited to this, but the packing ratio of a portion of the filter medium 124 may be set lower than that of the other portion. In this case, the filter medium 124 is divided into a plurality of layers in the passage direction of gas and the packing ratio of at least of one layer may be set lower than that of the other layers. In any case, the temperature fluctuation of the gas after passing the filter medium 124 can be controlled better than the filter unit using a filter medium having approximately the same packing ratio as the filter medium 134 in the entire unit.

Next, description will be made for the second temperature-change-controlled filter $120_2$ that can be used as the chemical filters CF1a and CF1b in FIG. 1, based on FIG. 6. The same symbols are used for components that are the same as or equivalent to those of the foregoing first temperature-change-controlled filter $120_1$, and brief or no description thereof will be presented.

The second temperature-change-controlled filter $120_2$ comprises: the holding frame 122; and two filter media (media) 124A and 124B whose peripheral areas are held by the holding frame 122 in the same manner as the filter medium 124. Note that the filter media 124A and 124B without the holding frame 122 can be provided in a predetermined position of the air-supply duct.

The filter media 124A and 124B are arranged along the air passage direction shown in the arrow 'v' with the gap 'b', and a mid-space layer 128 is formed between the filter media 124A and 124B. In the second temperature-change-controlled filter $1202_2$, the filter media 124A, 124B and the mid-space layer 128 constitute the filter section 126. The filter media 124A and 124B each consist of carbon fibers forming a honeycomb structure similar to the foregoing, and the thickness in the gas passage direction is a/2 and is set to ½ of the thickness in the gas passage direction of the filter medium 134 constituting the filter unit 130 shown in FIG. 4. Furthermore, the packing ratio of each filter medium 124A, 124B is set to the same packing ratio of the filter medium 134.

Next, the operation of the second temperature-change-controlled filter $120_2$ will be described comparing with the filter unit 130 shown in FIG. 4, based on FIG. 6.

Figure 6:
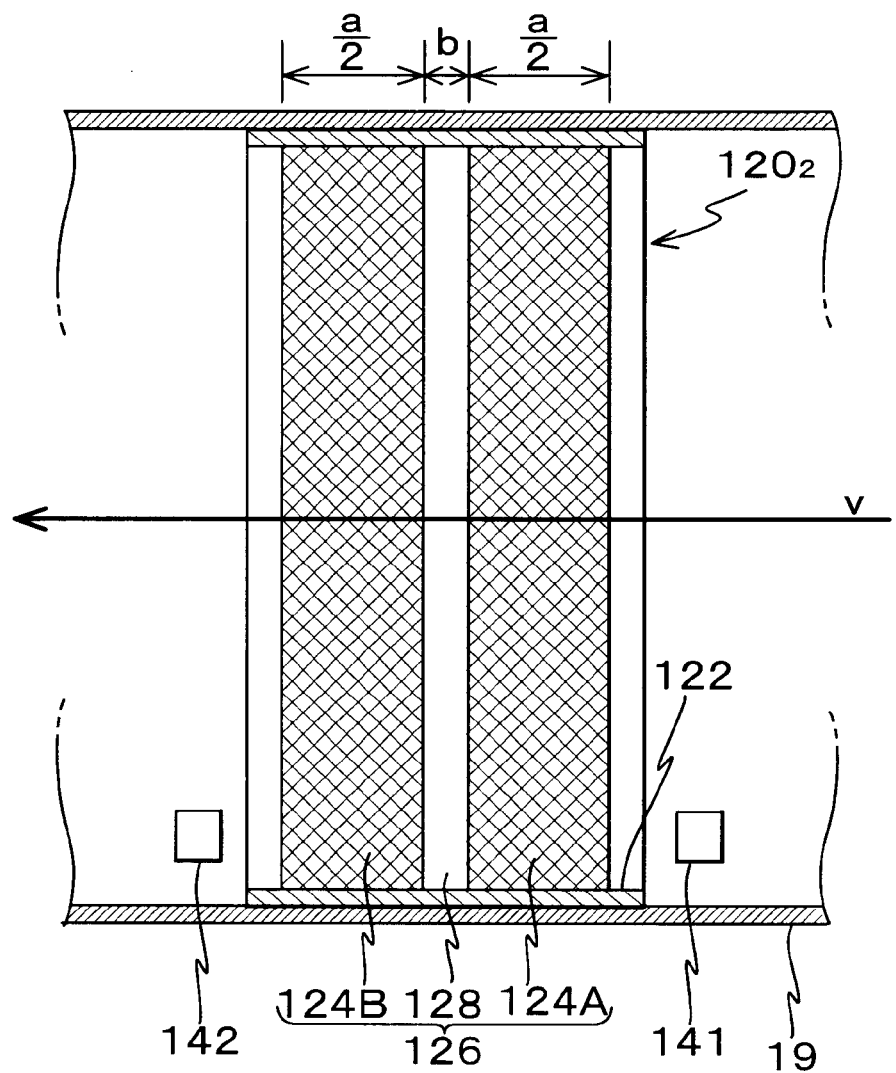
FIG. 6 is a view schematically showing the constitution of the second temperature-change-controlled filter chemical filters CF2$a$ and CF2$b$ of FIG. 1.

As described above, the filter medium 124A constituting the second temperature-change-controlled filter $120_2$ has the thickness about ½ of that of the filter medium 134A shown in FIG. 6. Accordingly, the air that passes through the filter medium 124A constituting the second temperature-change-controlled filter $120_2$ and reaches the mid-space layer 128 has about ½ of the moisture change amount of the air passing through the filter medium 134. Thus, since the quantity of moisture diffused or adsorbed by the filter medium 124A is less than that of the filter unit 130, the temperature fluctuation of air before and after passing the filter medium 124A can be controlled accordingly. Therefore, the gas that passed the filter medium 124A and has reached the mid-space layer 128 has a humidity fluctuation smaller than the humidity fluctuation before having passed the filter medium.

In other words, the filter medium 124A serves to limit the humidity fluctuation of the air supplied to the filter medium 124B in the downstream.

Accordingly, temperature fluctuation of the gas that has reached the mid-space layer 128, by passing the filter medium 124A having a thickness of about ½ of that of the filter medium 134, is controlled to about ½ of that of the gas passed the filter medium 134 of FIG. 4. Moreover, the humidity fluctuation is also smaller before and after passing the filter medium 124A. Thus, when the gas from the mid-space layer 128 passes through the filter medium 124B in the down stream, diffusion or adsorption of moisture is performed between the gas and the filter medium 124B. But, it contributes little to the temperature change of gas after passing through the filter medium 124B.

Note that the temperature change of the second temperature-change-controlled filter $120_2$ is smaller than that of the filter unit 130 because of having divided the medium into the filter medium 124A and the filter medium 124B. However, since the total thickness of the filter medium 124A and the filter medium 124B is the same as the thickness of the filter medium 134 constituting the filter unit 130, the capability of removing chemical materials from gas is also equivalent to that of the filter unit 130.

Next, a concrete example of the second temperature-change-controlled filter $120_2$ and a concrete experimental result obtained by using the filter will be described. Note that the same experimental unit as for the first temperature-change-controlled filter $120_1$ will be used in this experiment.

It is noted that the concrete experimental result by using the second temperature-change-controlled filter $120_2$ will be described in comparison with the filter unit 130 in FIG. 4 as in the foregoing case of the first temperature-change-controlled filter $120_1$.

The filter media 124A and 124B (density of each medium is about 0.09 g/cm³) each having a thickness in the gas passage direction of a/2 (=25 mm) are arranged with a gap 'b' (=10 mm), a mid-space layer 128, between them, and the second temperature-change-controlled filter $120_2$ is so formed that the total width of the filter medium in the gas passage direction substantially becomes 50 mm, and air is made to pass through the filter at the speed 'v' (=0.5 m/sec). At this point, the target temperature of the air is set to 23° C. In addition, the humidity fluctuation of the air before passing through the second temperature-change-controlled filter $120_2$ is controlled to have such a fluctuation width as leads the temperature fluctuation width of the air passing through the filter unit 130 shown in FIG. 4 to fall within 23° C.±0.03° C.

The experiment of the second temperature-change-controlled filter $120_2$ was performed under such speed and the humidity fluctuation, and it was found out that the temperature of the air (that is detected by the after-passage temperature sensor 142) immediately after passing the second temperature-controlled filter $120_2$ becomes 23° C.±0.015° C.

Thus, it is clear that the temperature error $\Delta T1$ of the air immediately after passing the filter section 126 with respect to the target temperature and the temperature error $\Delta T2$ of the air immediately after passing the filter unit 130 with respect to the target temperature have the relation of $\Delta T1/\Delta T2=0.5$.

Through the experiment, it was confirmed that the second temperature-change-controlled filter $120_2$ could control the temperature fluctuation of the air after passing the filter to approximately half of the temperature fluctuation caused by the filter unit 130 of FIG. 4. Furthermore, increase of the temperature error of the air after passing the filter is sufficiently within a permissible range, and thus it does not give adverse effect to the operation of the exposure apparatus main body 22 provided in the exposure room 16 of the main body chamber 12.

In this case, its capability of removing chemical materials does not decrease because the filter medium, in which the sum of the thickness of the filter media in the gas passage direction and the packing ratio are the same as those of the filter unit 130, can be used.

In the foregoing description, the filter section 126 constituting the second temperature-change-controlled filter $120_2$ has the two filter media 124A and 124B, which have a thickness of ½ of that of the filter medium 134 constituting the filter unit 130 in FIG. 4. The filter section 126 is not limited to this, but any number of the filter media constituting the filter section 126 and any thickness of each filter medium can be used as long as the sum of the thickness of the filter media in the gas passage direction is constant. For example, the number of the filter media may be two and the thickness of the filter media may be ⅓ (thickness=a/3) and ⅔ (thickness=2a/3) respectively of that of the filter medium constituting the filter unit 130 in FIG. 4, or the number of the filter media may be three and the thickness of each filter medium may be ⅓ (thickness=a/3) of the filter medium constituting the filter unit 130 in FIG. 4.

Further, the mid-space layer between the filter media 124A and 124B can also have any width 'b', and the width (thickness) can be set to be the optimal width on design, taking into consideration the total width of the second temperature-change-controlled filter $120_2$ in the gas passage direction and the removing power of the filter to the chemical material.

As the second temperature-change-controlled filter $120_2$, the filter media 124A and 124B having the same packing ratio as the filter medium 134 constituting the filter unit are used. The filter is not limited to this, but the packing ratio of one filter medium may be smaller than that of the other filter medium. Alternatively, the packing ratio of a portion of one filter medium may be reduced, or the packing ratio of a portion of each filter medium may be reduced. As described, when the packing ratio of a portion of the filter medium is reduced, adsorption of moisture in gas by the filter medium and diffusion of moisture to gas can be limited further, and thus the temperature error of the gas after passing through the filter section with respect to the target temperature can be smaller.

Next, description will be made of the air conditioning in the exposure apparatus having the above arrangement, based on FIG. 1 and with reference to FIG. 3.

First, the control unit 70 actuates the first and second blowers 58 and 64 to supply air to the reticle loader room 18, the wafer loader room 20, the exposure room 16 and the vicinity of the wafer stage WST in the exposure room 16 via the filter boxes AF1, AF2, AF3 and AF4 respectively, and the air conditioning of each section is performed. In this case, the air conditioning by a down flow is performed in the reticle loader room 18 and the wafer loader room 20. And, the air conditioning of each section of the exposure apparatus main body 22 during the foregoing exposure operation is performed by a side flow. And then, air returned to the return duct 42 via the return section 40 and 44, air returned to the return duct 48 via the return section 46, and air returned to the return duct 66 pass through the chemical filter CF2a provided at the exit area of these ducts connected to the machine chamber 14 (entrance area of the machine chamber 14 in this embodiment) Chemical pollutants contained in air in each return duct 42, 48 and 66 are adsorbed and removed by the chemical filter CF2a while the air passes through the filter.

Then, the chemically clean air that has passed through the chemical filter CF2a is mixed with chemically clean air that has been taken in from outside the exposure apparatus via the OA port 50 and that has passed through the chemical filter CF2b, and the mixture is cooled down to a predetermined temperature by the cooler 52 constituting the air conditioner. In this case of the embodiment, the control unit 70 controls the cooling operation of the cooler 52 while monitoring the output of the first temperature sensor 54. At this point, the air is cooled down to, for example, a range from slightly higher than 5° C. to about 15° C. in which dew condensation does not occur under the humidity and the pressure of the air passing the cooler section. Thus, since dew condensation does not occur on the surface of the cooler 52, a drain piping system is not provided in this embodiment. However, because control of the foregoing surface temperature of the cooler 52 might be difficult due to occurrence of a failure of the first temperature sensor 54 or a trouble in the cooler 52, the drain pan 68 is provided in this embodiment in consideration of such emergency.

Then, out of air that has been cooled down to the predetermined temperature and that has passed through the cooler 52, about 80% is supplied to the first heater 56, the remaining about 20% is supplied to the second heater 62 in the diverged path 60, and the air is heated to target temperatures severally. In this case, the control unit 70 performs a feedback control to the first heater 56 based on detection values of the second temperature sensor 72, and performs the feedback control to the second heater 62 based on detection values of the third temperature sensor 74. In this case, the target temperature (includes a temperature control range) of air blown out into the exposure room 16 via the air-supply duct 24 and the target temperature (includes the temperature control range) of air blown out to the vicinity of the wafer stage WST via the diverged path 60 can be set independently.

The considerably chemically clean air that has been heated to each target temperature by the first and second heaters 56 and 62 is supplied to the chemical filters CF1a and CF1b by the first and second blowers 58 and 64 severally. Then, air having passed through the chemical filter CF1a is supplied into the reticle loader 18, the wafer loader 20 and the exposure room 16 via the air-supply duct 24 in the main body chamber 12 and then the filter boxes AF1, AF2 and AF3 respectively. Air having passed through the chemical filter CF1b passes through the filter box AF4 to be supplied to the vicinity of the wafer stage WST (and the laser interferometer IF).

Since particles in air are substantially removed by passing the ULPA filter in the filter boxes AF1, AF2, AF3, AF4, only air of high cleanliness, in which particulates such as the particles and chemical pollutants are not contained, is supplied into the reticle loader 18, the wafer loader 20, the exposure room 16 and the vicinity of the wafer stage WST. And then, the air conditioning of the reticle loader system, the wafer loader system and the exposure apparatus main body 22 is performed by the clean air. The air conditioning is completed; chemically dirty air containing chemical pollutants emitted from the exposure apparatus main body 22 and the like is returned to the return ducts 42, 48 and 66, and the air conditioning of each section as described above is repeated thereafter.

Next, description will be made for the reason for arranging the chemical filters CF1a and CF1b each constituted by a first temperature-change-controlled filter $120_1$ (or $120_2$) and the chemical filters CF2a and CF2b each constituted by a filter unit 130 in the positions shown in FIG. 1.

In reasoning, the characteristic of each filter unit was taken into account. That is, the first reason is that although the first temperature-change-controlled filter $120_1$ (or $120_2$) has inferior capability of removing chemical pollutants comparing to the filter unit 130, it has higher capability of controlling the temperature fluctuation of the gas passing through the filter, and that the filter can be effectively used when it is arranged in a position that requires severe temperature adjustment. Accordingly, in this embodiment, the chemical filters CF1a and CF1b are arranged in the air-supply path for the exposure room 16 and the like, and reduction of exposure accuracy and the like caused by the increase of the gas temperature variation is limited as small as possible. On the other hand, since the filter unit 130 has superior capability of removing chemical pollutants and inferior capability of controlling the temperature fluctuation of the gas passing the filter comparing to the first temperature-change-controlled filter $120_1$ (or $120_2$). Thus, the filter unit 130 can be effectively used when it is arranged in a position where the temperature fluctuation does not cause a problem and where the capability of removing chemical materials is required. Accordingly, the chemical filters CF2a and CF2b (the filter unit 130) are arranged in an area where air is taken in from outside and an area where air is returned via the return duct.

The advantage of the combination of the two kinds of filters, i.e. the first temperature-change-controlled filter $120_1$ (or $120_2$) and the filter unit 130, was also taken into account. That is, the second reason is that by adopting the constitution where the air from which chemical pollutants has been effectively removed by the filter unit 130 is supplied to the first temperature-change-controlled filter $120_1$ (or $120_2$), chemical cleanliness inside the exposure room 16 and the like can be maintained sufficiently high even if the filter medium having low packing ratio of carbon fibers and large effect of controlling the temperature fluctuation is adopted as a filter medium constituting the filter section of the first temperature-change-controlled filter $120_1$ (or $120_2$). In this case, moreover, there exists an advantage that replacement of the first temperature-change-controlled filter $120_1$ (or $120_2$) is not necessary for a long period of time because the filter can be almost prevented from becoming dirty.

As described above in detail, according to this embodiment, the chemical filters CF1a and CF1b that each consist of a first temperature-change-controlled filter $120_1$ (or $120_2$), which removes chemical pollutants from gas and controls the gas temperature fluctuation to within a predetermined range after passing the filter, are severally arranged in a portion of the air-supply duct 24 as the ventilation path extending from the machine chamber 14 to the main body chamber 12 and a portion of the diverged path 60. Therefore, spaces downstream from the chemical filters CF1a and CF1b including the ventilation path (more specifically, the inside spaces of the exposure room 16, the reticle loader room 18 an the wafer loader 20, and the space near the wafer stage WST) become chemically clean and free from chemical pollutants. Air whose temperature is set to a target temperature by the air conditioning unit, most part of which is housed in the machine chamber 14, passes through the chemical filters CF1a and CF1b, and thus the temperature fluctuation after passing the filter is controlled.

In this case, the exposure room 16, in which the exposure apparatus main body 22 is housed, is provided in the main body chamber 12, and the chemical filter CF1a is arranged in the air-supply duct 24 as a supply path of air to be supplied to the exposure room 16. Accordingly, air of high chemical cleanliness from which chemical pollutants is sufficiently removed and of which temperature variation is controlled is supplied into the exposure room 16. Thus, the peripheral atmosphere of the exposure apparatus main body 22 becomes chemically clean. With this constitution, occurrence of the shortcoming such as the illumination reduction caused by tarnish of the optical members in the illumination optical system and the like can be effectively controlled for a long period of time.

The exposure apparatus main body 22 includes: the wafer stage WST that holds the wafer W; and the interferometer IF that measures the position of the wafer stage WST, and the chemical filter CF1b is arranged in the supply path of air, which is supplied to a space in the exposure room 16 where the wafer stage WST and the interferometer IF are arranged. Accordingly, the measurement error of the interferometer caused by air variation (temperature variation) can be limited to a minimum, and positional control of the wafer stage WST that particularly requires accuracy can be performed with required accuracy.

In addition, the wafer loader room 20 housing the wafer loader systems (84, 86 and 88) that carries a wafer W onto the wafer stage WST of the exposure apparatus main body 22 and carries a wafer W out of the wafer stage WST is provided in the main body chamber 12, and the air passed the chemical filter CF1a is also supplied to the wafer loader room 20. Therefore, the inside of the wafer loader room 20 can be chemically clean and stable in temperature.

Furthermore, the reticle loader room 18 housing the reticle loader systems (80 and 82) that carries a reticle R onto the reticle stage RST of the exposure apparatus main body 22 and carries a reticle R out of the reticle stage RST is provided in the main body chamber 12, and air having passed the chemical filter CF1a is also supplied to the reticle loader room 18. Therefore, the inside of the reticle loader room 18 can be chemically clean and stable in temperature.

Moreover, in the exposure apparatus 10 of this embodiment, the circulation path of air is constituted which starts from and returns to the machine chamber 14 via the main body chamber 12, and the chemical filters CF2a and CF2b having a higher capability of removing chemical pollutants than that of the first filter unit are respectively arranged in the exhaust paths (42, 48, 66) from the main body chamber to the machine chamber 14 and in the path of the outside air taken in through the OA port 50 provided in the machine chamber 14. Thus, the chemical filter CF2a arranged in the exhaust path from the main body chamber 12 to the machine chamber 14 effectively removes chemical pollutants in air, which are emitted by the exposure apparatus main body 22. The chemical filter CF2b, which is arranged in the path of the outside air taken in through the OA port 50 of the machine chamber 14, takes chemically clean outside air into the apparatus while removing chemical pollutants from the air. And then, the air is supplied into the main body chamber 12 again by the air conditioning unit via the chemical filters CF1a and CF1b. Therefore, the atmosphere around the exposure apparatus main body 22 in the main body chamber 12 can be kept in a chemically, highly clean state, and occurrence of the illumination reduction caused by tarnish of the optical members can be effectively limited for a long period of time. And chemically clean air from which chemical pollutants have been removed by the chemical filters CF2a and CF2b is supplied to the chemical filters CF1a and CF1b. Furthermore, because the temperature fluctuation need not be considered of the exhaust path from the main body chamber to the machine chamber and the path for outside air of the machine chamber 14, no problem occurs even if the temperature fluctuation of air after passing the filter is large. Accordingly, the filter unit having a high capability of removing chemical pollutants can be used. Therefore, the lifetime of the chemical filters CF1a and CF1b lengthens, and replacement of the filter is unnecessary for a long period of time.

Further, since at least the inner wall area of the air-supply duct 24 in the downstream of the chemical filter CF1a is made of a material emitting little gas such as SUS and Teflon (Registered trademark), little gas is emitted in the air-supply duct area in the downstream of the chemical filter CF1a. Thus, really chemically clean air can be supplied to the exposure room 16 in which the exposure apparatus main body 22 is housed, the reticle loader room 18 and the wafer loader room 20.

In the foregoing embodiment, the temperature adjustment unit comprises the cooler 52 and the heaters 56 and 62, but the temperature adjustment unit according to the present invention is not limited to this. For example, if the temperature of the atmosphere around the exposure apparatus main body 22 becomes high during exposure due to the energy of the exposure beam, and the apparatus comprises the circulation system, as in the above embodiment, where air exhausted from the exposure room 16 returns to the temperature adjustment unit via the return section, the temperature of the air that returns to the temperature adjustment unit is always higher than a set temperature (target temperature). Thus, the exposure apparatus may comprise only a cooler. In such a case, the temperature of the air before passing the chemical filters CF1a and CF1b can be adjusted to within a predetermined range by cooling the air hotter than the target temperature by the cooler.

In the case where the gas cooler than a target temperature is supplied from the outside, the temperature of the gas before passing the filter unit can be adjusted to within a predetermined range relative to the target temperature by heating the gas by a heater. Thus, only a heater may be provided in the exposure apparatus.

In the foregoing embodiment, description was made for the case where the gas for air conditioning is supplied in a circulated manner into the main body chamber 12. The exposure apparatus is not limited to this, but can adopt the constitution in which air from the outside is supplied into the main body chamber 12 after passing the chemical filters CF1a and CF1b via the machine chamber 14 and is discharged from the main body chamber 12 to the outside. In such a case, it is also desirable that the filter unit having a high capability of removing chemical pollutants be arranged at the outside-air intake provided in the machine chamber 14 or the like. The same effect as the foregoing embodiment can be expected in this case as well.

Note that the numerical values cited in the descriptions of the first temperature-change-controlled filters $120_1$ and $120_2$, the filter unit 130 and the like, for example a density of carbon fibers constituting a filter medium and the numerical values of the total thicknesses in the gas passage direction, are just examples. The present invention is not limited to such numerical values.

Also in the above embodiment, description was made for the case where carbon fibers forming a honeycomb structure are used as a filter medium constituting the filter section 126 of the temperature-change-controlled filter $120_1$, $120_2$, and as that of the filter unit 130. But the filter medium is not limited to this, but a material having a characteristic to remove at least one of an acid substance, an alkaline substance and an organic substance can be used such as an attached type to have one of cationic component and anionic component attached to a porous member, e.g. an activated carbon or ceramic; an ion-exchange type to be composed of fibers, resin sheets or the like having ion-exchange groups; and a substance adsorption type to be constituted by a porous member such as a granular activated carbon, powder activated carbon or ceramic.

Even if a filter medium that is made of any of the above materials other than carbon fiber is used as the filter medium, the same effect as the foregoing can be obtained by adopting the concept that the packing ratio of the filter medium is reduced and/or that a plurality of such filter media are spaced apart so as to control the moisture adsorption and diffusion of the filter unit.

Particularly, in the second temperature-change-controlled filter $120_2$, a plurality of filter media constituting the filter section do not need to be made of the same material, and the combination of a filter medium to remove alkaline substances, a filter medium to remove acid substances and a filter medium to remove organic substances can be used.

Note that the exemplary experiments of the first temperature-change-controlled filter and the second temperature-change-controlled filter show experimental results when filter media made of carbon fiber is used. Accordingly, experimental results are different when filter media made of any of the foregoing other materials are used because they are different in moisture adsorption/diffusion quantity per unit weight, and when designing the filter, an optimal value (the packing ratio of the filter medium and the thickness in the gas passage direction) is also different.

In the foregoing embodiment, an activated carbon filter, a zeolite filter or the like may be used as the chemical filters CF1a, CF1b, CF2a and CF2b. In this case, almost all chemical pollutants generated in the clean room and the exposure apparatus can be removed. Specifically, a silicon series organic material such as siloxane (a material having an Si—O chain as an axis) or silazane (a material having an Si—N chain as an axis) causes problems, which exists as an impurity in spaces between optical elements in the chamber, the projection optical system and the illumination optical system. In more detail, siloxane is a material called "annular siloxane", a circular Si—O chain, and is contained in adhesive agent, sealing agent, paint and the like used in projection exposure apparatuses, and it is emitted as gas due to ageing. It is well known that cyclic siloxane adheres to the surface of a semiconductor substrate such as a silicon wafer and the surface of a dielectric such as a lens, and that, when irradiated with ultraviolet light (UV light), the cyclic siloxane is oxidized and causes tarnish made of silicon oxide on the surfaces of the optical elements.

As a kind of silazane there is an HMDS (hexa-methyl-disilazane) having two pieces of Si, which is used as a pretreatment agent in a resist coating process by many users.

The HMDS, when reacting with water, changes (hydrolysis) to a material called silanol that quite easily adheres to the surface of a semiconductor substrate or the surface of a dielectric. In addition, when irradiated with ultraviolet light, it is oxidized similarly to siloxane, and causes tarnish made of silicon oxide on the surfaces of the optical elements. It is noted that silazane creates ammonia by the hydrolysis, and that the ammonia promotes tarnish by siloxane.

The activated carbon filter or the zeolite filter can remove organic materials having silicon such as siloxane and silazane.

In a projection exposure apparatus that uses a KrF excimer laser beam, an ArF excimer laser beam and a laser beam with a shorter wavelength, cleaning of the surfaces of the optical elements by a so-called optical cleaning is usually performed, and the optical cleaning removes organic materials (such as hydrocarbon) adhering to the surfaces of the optical elements so that the organic materials float in the air. However, such organic materials can be removed by the activated carbon filter or the zeolite filter.

Recently, not only the organic materials having silicon but also a plasticizer (such as phthalate ester), a fire retardant (phosphoric acid and chlorine series material) and the like emitted from the wiring, plastic and the like in the chamber have been found to cause problems as impurities. Such plasticizer, fire retardant and the like can also be removed by the activated carbon filter or the zeolite filter.

Note that, in the foregoing embodiment, the exposure apparatus comprises: the first blower 58; the second blower 64; a drive member (for example, a zoom lens, an aperture stop and the like) to drive the optical elements in order to change illumination conditions for the reticle; and the like. The blowers and the drive member each have a motor and a bearing to support a motor shaft, as a sliding section, and lubricant is used to keep the sliding of the bearing smooth. For example, grease that has fluorine, and that is a material emitting little outgas (such as carbide as an organic substance), is used as the lubricant. The quantity of the outgas (the organic material) generated from the grease when about 10 mg is heated at 60° C. for ten minutes in a nitrogen atmosphere is 150 $\mu g/m^3$ or less on a toluene reduced value. Particularly, it is desirable that the quantity of outgas (the organic material) generated under the heating conditions be 100 $\mu g/m^3$ or less on the toluene reduced value. More preferably, it is 40 $\mu g/m^3$ or less. Demnum (product name) manufactured by Daikin Industries, Ltd. is known as grease with the value of 40 $\mu g/m^3$.

As described, contamination inside the chamber can be limited by using the foregoing grease to the sliding section of the blowers and the drive member arranged in the chamber, and thus the lifetime of the chemical filters arranged in the chamber can be lengthened.

In the embodiment, description was made for the case where the temperature-change-controlled filters were provided in the vicinity of the machine chamber in the main body chamber and in the vicinity of the wafer stage. Not being limited to those areas, such filters can be provided at supply-port areas of air supplied to the reticle loader room and the wafer loader room. With the arrangement of the chemical filters, the insides of the reticle loader room and the wafer loader room become chemically cleaner. Thus, the atmosphere in the exposure room is not contaminated when the loader room and the exposure room are connected during reticle or wafer exchange, and the exposure accuracy can be maintain at a high level.

Furthermore, any arrangement of the chemical filters CF1a, CF1b and the like, whose description was made in the embodiment, and any constitution of the air conditioning unit, the ventilation path and the like shown in FIG. 1 are possible.

In the embodiment, description was made for the case where the reticle loader room, the wafer loader room and the exposure room are provided in the main body chamber. Not being limited to this, only the exposure room may be provided in the main body chamber, and the reticle loader room and the wafer loader room may be provided in another environmental control chamber together or in other chambers separately.

Still further, in the embodiment, description was made for the case where the machine chamber is provided separately from the main body chamber. But, one chamber is comparted by a partition to form the main body chamber housing the exposure apparatus main body and the machine chamber.

In FIG. 1, the machine chamber is arranged adjacent to the main body chamber, but the machine chamber may be arranged under the floor of a clean room (a utility space) or the like. Furthermore, the light source may also be arranged under the floor, and the air conditioning unit may control the pressure as well as the temperature of air.

In the case where ArF excimer laser beam (the wavelength=193 nm) is used as the illumination light for exposure, inert gas (such as nitrogen) is supplied into the mirror barrel of the projection optical system and the case housing the projection optical system PL, similarly to the illumination optical system 28. Moreover, when $F_2$ laser beam (the wave length=157 nm) is used as the illumination light for exposure, the reticle stage and the wafer stage are severally arranged in sub-chambers and inert gas (such as helium) is supplied to between the illumination optical system 28 and the projection optical system PL and between the projection optical system and the wafer W, in addition to the illumination optical system 28 and the projection optical system PL. Therefore, in an exposure apparatus where at least a portion of an illumination optical path extending from the light source (including inside thereof) to the wafer W is closed and where inert gas or the like is supplied in the closed portion, it is preferable that a chemical material removing filter (the chemical filter) is provided in, for example, the exhaust path or the exit thereof, through which the inert gas supplied to the illumination optical system passes. Of course, the chemical filter maybe provided in an intake path or the entrance thereof for the inert gas, which is particularly effective when the inert gas retrieved is used again after cleaning. As described above, when light in a vacuum ultraviolet wavelength range of, e.g., about 120 nm to 200 nm is used as the illumination light for exposure, the inert gas (such as a nitrogen gas and a helium gas) is used as the air for air conditioning. Accordingly, the environmental control unit of the present invention includes a gas-conditioning unit that supplies (may supply and circulate) the inert gas and the like and adjusts the temperature.

Note that, in the foregoing embodiment, description was made for the case where the KrF excimer laser, the ArF excimer laser or the like is used as the light source. The light source is not limited to this, but the $F_2$ laser or an $Ar_2$ laser may be used. Alternatively, a high harmonic wave of a metal vapor laser or a YAG laser may be used as the illumination light for exposure, or a higher harmonic wave may be used which is obtained with wavelength conversion into ultraviolet by using a non-linear optical crystal after amplifying single wavelength laser light, infrared or visible, emitted from a DFB semiconductor laser device or a fiber laser by a fiber amplifier having, for example, erbium (Er) (or both erbium and ytterbium (Yb)) doped.

Furthermore, the present invention can be applied not only to the exposure apparatus of a step-and-repeat method, a step-and-scan method or a step-and-stitch method, but also to a mirror projection aligner, an exposure apparatus of a proximity method and a photorepeater. In other words, the present invention can be applied to any exposure apparatus as long as the apparatus has the environmental control unit (such as the air conditioning unit) regardless of the constitution of the exposure apparatus main body.

A Device Manufacturing Method

Next, an embodiment of the method of manufacturing devices using a lithography system and exposure apparatus thereof according to the above embodiments will be described.

Figure 7:
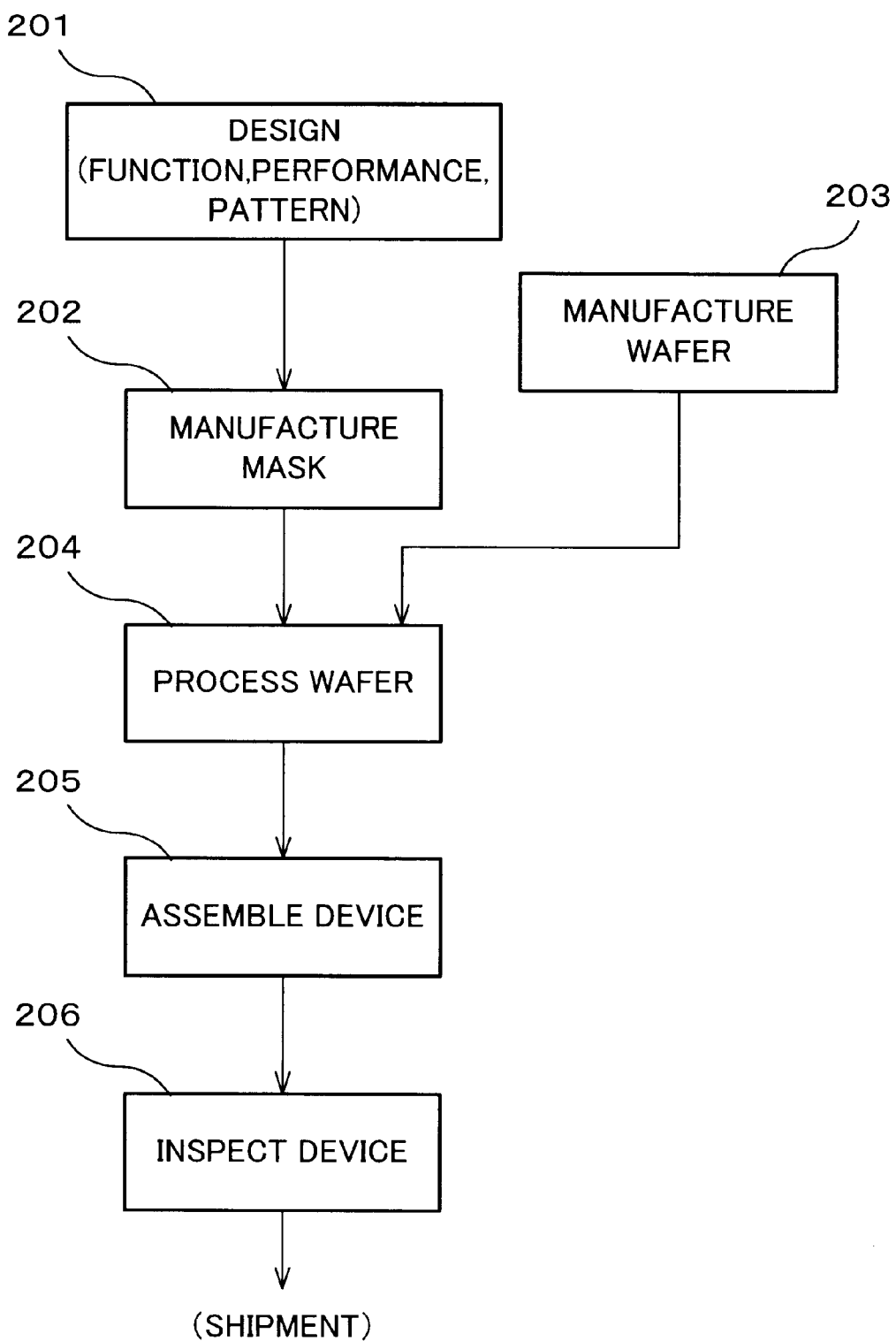
FIG. 7 is a flow chart for explaining a device manufacturing method according to this invention.

FIG. 7 is a flow chart for the manufacture of devices (semiconductor chips such as IC or LSI, liquid crystal panels, CCD's, thin magnetic heads, micro machines, or the like) in this embodiment. As shown in FIG. 7, in step 201 (design step), function/performance design for the devices (e.g., circuit design for semiconductor devices) is performed and pattern design is performed to implement the function. In step 202 (mask manufacturing step), masks on which a different sub-pattern of the designed circuit is formed are produced. In step 203 (wafer manufacturing step), wafers are manufactured by using silicon material or the like.

In step 204 (wafer processing step), actual circuits and the like are formed on the wafers by lithography or the like using the masks and the wafers prepared in steps 201 through 203, as will be described later. In step 205 (device assembly step), the devices are assembled from the wafers processed in step 204. Step 205 includes processes such as dicing, bonding, and packaging (chip encapsulation).

Finally, in step 206 (inspection step), a test on the operation of each of the devices, durability test, and the like are performed. After these steps, the process ends and the devices are shipped out.

Figure 8:
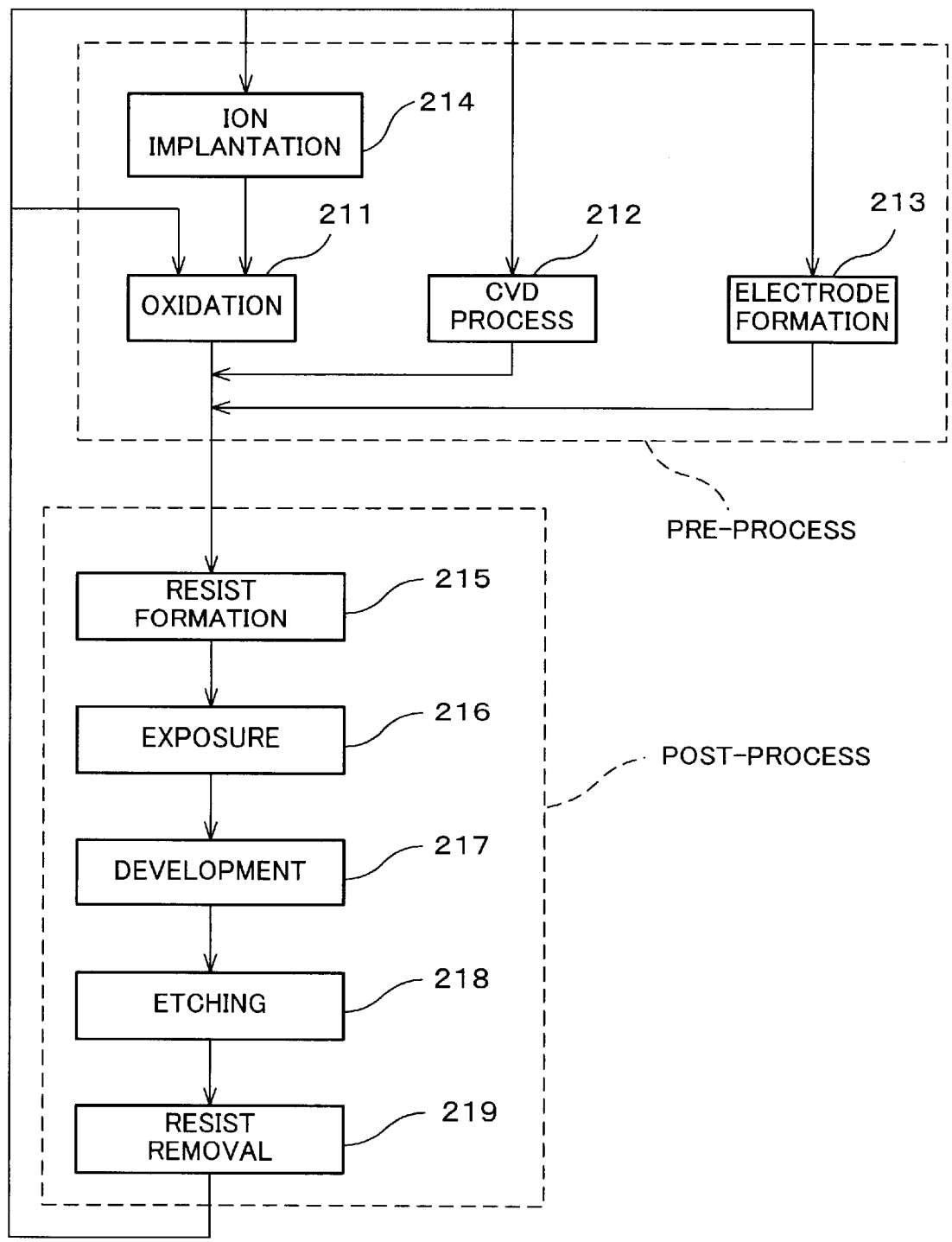
FIG. 8 is a flow chart showing a process of step 204 of FIG. 7.

FIG. 8 is a flow chart showing a detailed example of step 204 described above in manufacturing semiconductor devices. Referring to FIG. 8, in step 211 (oxidation step), the surface of a wafer is oxidized. In step 212 (CVD step), an insulating film is formed on the wafer surface. In step 213 (electrode formation step), electrodes are formed on the wafer by vapor deposition. In step 214 (ion implantation step), ions are implanted into the wafer. Steps 211 through 214 described above constitute a pre-process for each step in the wafer process and are selectively executed in accordance with the processing required in each step.

When the above pre-process is completed in each step in the wafer process, a post-process is executed as follows. In this post-process, firs to fall, in step 215 (resist formation step), the wafer is coated with a photosensitive material (resist). In step 216, the above exposure apparatus transfers a sub-pattern of the circuit on a mask onto the wafer according to the above method. In step 217 (development step), the exposed wafer is developed. In step 218 (etching step), an exposing member on portions other than portions on which the resist is left is removed by etching. In step 219 (resist removing step), the unnecessary resist after the etching is removed.

By repeatedly performing these pre-process and post-process, a multiple-layer circuit pattern is formed on each shot-area of the wafer.

According to the device manufacturing method of this embodiment described above, in the exposure step (step 216), the exposure apparatus 10 of the above embodiment is used, and therefore it is possible to effectively limit the decrease of exposure accuracy and the like due to chemical pollutants, temperature fluctuation, etc., for a long period of time and thus to manufacture highly-integrated devices with high productivity.

Although the embodiment of the present invention that has been described is a preferable current embodiment, the skilled in the art of a lithography system would easily conceive of making a lot of additions, variations and substitutions to the foregoing embodiment without departing from the spirit and the scope of the present invention. All of such additions, variations and substitutions are included in the scope of the present invention that is clarified most appropriately in the following claims.

What is claimed is:

1. An exposure apparatus, comprising:

an exposure apparatus main body that exposes a substrate to an energy beam so as to form a predetermined pattern on said substrate;

a main body chamber that encloses at least a portion of said exposure apparatus main body;

an environmental control unit connected to said main chamber to supply a predetermined gas into said main body chamber to control an environment inside said main body chamber; and at least one first filter unit that is arranged in a portion of a path of said gas supplied into said main body chamber by said environmental control unit, removes chemical pollutants from said gas, and controls temperature fluctuation of said gas that occurs while said gas is passing through the first filter unit to within a predetermined range.

2. An exposure apparatus according to claim 1, wherein said first filter unit controls temperature fluctuation of said gas that occurs while said gas is passing through the first filter unit such that temperature error, relative to a target temperature, of said gas after passing through lies within a predetermined range.

3. An exposure apparatus according to claim 1, wherein said first filter unit comprises a filter section having one or more filter media that remove chemical pollutants contained in said gas and that perform adsorption of moisture in said gas and discharge of moisture into said gas.

4. An exposure apparatus according to claim 3, wherein said filter section has at least two filter media that are arranged a predetermined distance apart in a passage direction of said gas.

5. An exposure apparatus according to claim 3, wherein at least one of said filter media has at least one portion of which a packing ratio is set to be lower than the other portions.

6. An exposure apparatus according to claim 3, further comprising:

a machine chamber that houses at least a portion of said environmental control unit and is connected to said main body chamber to constitute a circulation path of said gas together with said main body chamber; and at least one second filter unit arranged in an exhaust path returning from said main body chamber to said machine chamber, the second filter unit comprising a filter medium having a higher packing ratio compared to a packing ratio of a filter medium of said first filter unit.

7. An exposure apparatus according to claim 3, further comprising:

a machine chamber that houses at least a portion of said environmental control unit and is provided with an outside gas intake; and at least one second filter unit arranged in a path of outside gas taken in through said outside gas intake, the second filter unit comprising a filter medium having a higher packing ratio compared to a packing ratio of a filter medium of said first filter unit.

8. An exposure apparatus according to claim 7, wherein a circulation path of said gas, which starts from said machine chamber and returns to said machine chamber through said main body chamber, is constructed.

9. An exposure apparatus according to claim 7, wherein said temperature adjustment unit further includes a heating unit that heats said gas supplied into said main body chamber by said gas supply fan.

10. An exposure apparatus according to claim 6, wherein said temperature adjustment unit includes a heating unit that heats said gas supplied into said main body chamber by said gas supply fan.

11. An exposure apparatus according to claim 1, wherein an exposure room that houses said exposure apparatus main body is provided in said main body chamber, and wherein said first filter unit is arranged in a supply path of said gas supplied to said exposure room.

12. An exposure apparatus according to claim 1, wherein said exposure apparatus main body includes a substrate stage that holds said substrate and an interferometer that measures the position of said substrate stage, and wherein said first filter unit is arranged in a supply path of said gas supplied into a portion of the space of said main body chamber where said substrate stage and said interferometer are arranged.

13. An exposure apparatus according to claim 1, further comprising:

a machine chamber that houses at least a portion of said environmental control unit and is connected to said main body chamber to constitute a circulation path of said gas together with said main body chamber; and at least one second filter unit arranged in an exhaust path returning from said main body chamber to said machine chamber, the second filter unit having a higher removal ratio of said chemical pollutants than said first filter unit.

14. An exposure apparatus according to claimi 1, wherein said exposure apparatus body includes a substrate stage that holds said substrate and an interferometer that measures the position of said substrate stage, and said first filter unit is arranged in a supply path of said gas supplied into a portion of the space of said main body chamber where said substrate stage and said interferometer are arranged.

15. An exposure apparatus according to claim 1, wherein said exposure apparatus a substrate transportation system housing chamber in which a substrate transportation system that carries said substrate into said exposure apparatus main body and that carries said substrate out of said exposure apparatus main body is housed, and wherein said first filter unit is arranged in a supply path of said gas supplied into said substrate transportation system housing chamber.

16. An exposure apparatus according to claim 1, further comprising:

a machine chamber that houses at least a portion of said environmental control unit and is provided with an outside gas intake; and at least one second filter unit arranged in a path of outside gas taken in through said outside gas intake, the second filter unit having a higher removal ratio of said chemical pollutants than said first filter unit.

17. An exposure apparatus according to claim 1, wherein the surface of said substrate is coated with chemically amplified resist as a photosensitive emulsion.

18. An exposure apparatus according to claim 1, wherein said first filter unit comprises a filter medium that performs adsorption of said chemical pollutants, and said temperature fluctuation of said gas occurs because said filter medium performs adsorption of moisture in said gas and discharge of said moisture into said gas.

19. An exposure apparatus according to claim 18, wherein said filter medium is one of carbon fiber, granular activated carbon having ion-exchange groups, powder activated carbon and ceramic.

20. An exposure apparatus according to claim 18, wherein said filter medium performs adsorption of at least one of an acid substantce, an alkaline substance and an organic substance.

21. An device manufacturing method comprising:

performing an exposure with an exposure apparatus comprising:
- an exposure apparatus main body that exposes a substrate to an energy beam so as to form a predetermined pattern on said substrate;
- a main body chamber that encloses at least a portion of said exposure apparatus main body;
- an environmental control unit connected to said main chamber to supply a predetermined gas into said main body chamber to control an environment inside said main body chamber; and
- at least one first filter unit that is arranged in a portion of a path of said gas supplied into said main body chamber by said environmental control unit, removes chemical pollutants from said gas, and controls temperature fluctuation of said gas that occurs while said gas is passing through the first filter unit to within a predetermined range.

* * * * *